United States Patent
Kamijo et al.

(10) Patent No.: US 11,877,391 B2
(45) Date of Patent: Jan. 16, 2024

(54) CONDUCTIVE FILM AND CONDUCTIVE FILM ROLL, ELECTRONIC PAPER, TOUCH PANEL AND FLAT-PANEL DISPLAY COMPRISING THE SAME

(71) Applicant: ASAHI KASEI KABUSHIKI KAISHA, Tokyo (JP)

(72) Inventors: Takeshi Kamijo, Tokyo (JP); Sora Hida, Tokyo (JP); Tetsuro Sugimoto, Tokyo (JP); Yu Tomono, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 551 days.

(21) Appl. No.: 17/264,493

(22) PCT Filed: Jul. 30, 2019

(86) PCT No.: PCT/JP2019/029912
§ 371 (c)(1),
(2) Date: Jan. 29, 2021

(87) PCT Pub. No.: WO2020/027162
PCT Pub. Date: Feb. 6, 2020

(65) Prior Publication Data
US 2021/0321512 A1 Oct. 14, 2021

(30) Foreign Application Priority Data

Jul. 30, 2018 (JP) ................................. 2018-142057
Jul. 30, 2018 (JP) ................................. 2018-142101

(51) Int. Cl.
*H05K 1/09* (2006.01)
*H05K 1/02* (2006.01)
(Continued)

(52) U.S. Cl.
CPC ......... *H05K 1/0277* (2013.01); *G02F 1/1676* (2019.01); *G06F 3/0445* (2019.05);
(Continued)

(58) Field of Classification Search
CPC ............... H05K 1/0263; H05K 1/0265; H05K 1/09–1/097
See application file for complete search history.

(56) References Cited

U.S. PATENT DOCUMENTS

| 5,448,037 A | 9/1995 | Takase et al. |
| 6,703,586 B1 | 3/2004 | Kast |

(Continued)

FOREIGN PATENT DOCUMENTS

| CN | 102326460 A | 1/2012 |
| CN | 103329642 A | 9/2013 |

(Continued)

OTHER PUBLICATIONS

International Search Report (PCT/ISA/210) issued in PCT/JP2019/029912 dated Oct. 29, 2019.
(Continued)

*Primary Examiner* — Jeremy C Norris
(74) *Attorney, Agent, or Firm* — Birch, Stewart, Kolasch & Birch, LLP

(57) ABSTRACT

An object of the present invention is to provide a conductive film that is excellent in flexibility while maintaining its sufficient transparency and conductivity, and a conductive film roll, an electronic paper, a touch panel, and a flat-panel display having the same.
A conductive film having a transparent substrate and a conductive part having a fine metal wire pattern disposed on one side or both sides of the transparent substrate, wherein the fine metal wire pattern is constituted by a fine metal wire, and (Continued)

the conductive film satisfies the following condition (i) or (ii):

(i) the fine metal wire has voids, and when the cross-sectional area of the fine metal wire is defined as $S_M$ and the total cross-sectional area of the voids included in the cross-section of the fine metal wire is defined as $S_{Vtotal}$ on the cross-section of the fine metal wire perpendicular to the direction of drawing of the fine metal wire, $S_{Vtotal}/S_M$ is 0.10 or more and 0.40 or less; and (ii) when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ is 0.40 or more and 0.90 or less.

20 Claims, 8 Drawing Sheets

(51) Int. Cl.
| | |
|---|---|
| *G02F 1/1676* | (2019.01) |
| *G06F 3/044* | (2006.01) |
| *H05K 3/12* | (2006.01) |
| *H05K 3/38* | (2006.01) |
| *G02F 1/16757* | (2019.01) |
| *G02F 1/167* | (2019.01) |
| *H05K 3/28* | (2006.01) |

(52) U.S. Cl.
CPC ......... H05K 3/1275 (2013.01); H05K 3/1283 (2013.01); H05K 3/388 (2013.01); *G02F 1/167* (2013.01); *G02F 1/16757* (2019.01); *G06F 3/0446* (2019.05); *G06F 2203/04102* (2013.01); *H05K 1/0274* (2013.01); *H05K 1/097* (2013.01); *H05K 3/282* (2013.01); *H05K 2201/037* (2013.01)

(56) References Cited

U.S. PATENT DOCUMENTS

| | | |
|---|---|---|
| 2007/0187383 A1 | 8/2007 | Wipfler et al. |
| 2009/0121584 A1 | 5/2009 | Nishimura et al. |
| 2011/0122596 A1 | 5/2011 | Miyazaki et al. |
| 2012/0061130 A1 | 3/2012 | Yoshi et al. |
| 2012/0261404 A1 | 10/2012 | Choi et al. |
| 2013/0075383 A1 | 3/2013 | Kim |
| 2013/0294037 A1 | 11/2013 | Kuriki et al. |
| 2014/0255799 A1 | 9/2014 | Anandan et al. |
| 2015/0268770 A1 | 9/2015 | Cok |
| 2016/0155814 A1 | 6/2016 | Ogawa et al. |
| 2016/0249413 A1 | 8/2016 | Lim et al. |
| 2017/0171916 A1 | 6/2017 | Kim et al. |
| 2017/0277324 A1 | 9/2017 | Dan et al. |
| 2017/0338003 A1 | 11/2017 | Haishi et al. |
| 2017/0353996 A1 | 12/2017 | Lee et al. |
| 2018/0171159 A1 | 6/2018 | Ooi et al. |
| 2018/0159014 A1 | 8/2018 | Chiang et al. |
| 2018/0338352 A1 | 11/2018 | Torita |
| 2019/0235670 A1 | 8/2019 | Matsubara et al. |
| 2020/0013521 A1 | 1/2020 | Ohno et al. |
| 2020/0170125 A1 | 5/2020 | Saito et al. |

FOREIGN PATENT DOCUMENTS

| | | |
|---|---|---|
| CN | 107615224 A | 1/2018 |
| DE | 693 14 721 T2 | 2/1998 |
| EP | 1 688 284 A2 | 8/2006 |
| EP | 3 660 112 A1 | 6/2020 |
| JP | 2000-312057 A | 11/2000 |
| JP | 2004-205353 A | 7/2004 |
| JP | 2006-24500 A | 1/2006 |
| JP | 2008-243946 A | 10/2008 |
| JP | 2010-80826 A | 4/2010 |
| JP | 2010-102802 A | 5/2010 |
| JP | 2011-34889 A | 2/2011 |
| JP | 2011-91788 A | 5/2011 |
| JP | 2011-124536 A | 6/2011 |
| JP | 2011-228018 A | 11/2011 |
| JP | 2012-185607 A | 9/2012 |
| JP | 2013-516043 A | 5/2013 |
| JP | 2013-206722 A | 3/2014 |
| JP | 2016-68470 A | 5/2016 |
| JP | 2016-91658 A | 5/2016 |
| JP | 2016-110931 A | 6/2016 |
| JP | 2016-139688 A | 8/2016 |
| JP | 2016-146334 A | 8/2016 |
| JP | 2017-19274 A | 1/2017 |
| JP | 2017-98054 A | 6/2017 |
| JP | 2017-143094 A | 8/2017 |
| JP | 2017-212136 A | 11/2017 |
| JP | 2018-50135 A | 3/2018 |
| JP | 2018-73734 A | 5/2018 |
| JP | 2018-138456 A | 9/2018 |
| JP | 2019-104110 A | 6/2019 |
| WO | WO 2007/034832 A1 | 3/2007 |
| WO | WO 2014/034920 A1 | 3/2014 |
| WO | WO 2015/012264 A1 | 1/2015 |
| WO | WO 2016/195047 A1 | 12/2016 |
| WO | WO 2018/003399 A1 | 1/2018 |
| WO | WO 2018/169012 A1 | 9/2018 |
| WO | WO 2018/008530 A1 | 11/2018 |
| WO | WO 2019/017363 A1 | 1/2019 |
| WO | WO 2019/022230 A1 | 1/2019 |

OTHER PUBLICATIONS

Written Opinion (PCT/ISA/237) issued in PCT/JP2019/029912 dated Oct. 29, 2019.
Yamada et al., "Nanoparticle chemisorption printing technique for conductive silver patterning with submicron resolution", nature communications 7, Article No. 11402, 2016, pp. 1-9.
U.S. Appl. No. 17/796,216, filed Jul. 28, 2022, Not Yet Assigned.
International Preliminary Report on Patentability and Written Opinion of the International Searching Authority (Forms PCT/IB/326, PCT/IB/373, and PCT/ISA/237) for International Application No. PCT/JP2019/029912, dated Feb. 11, 2021, with English translation of the Written Opinion.
Supplementary European Search Report for European Application No. 21747410.5, dated Jun. 16, 2023.
International Preliminary Report on Patentability, dated Aug. 11, 2022, and Written Opinion of the International Searching Authority, dated Mar. 16, 2021, for International Application No. PCT/JP2021/003031, with an English translation.
International Search Report for International Application No. PCT/JP2021/003031, dated Mar. 16, 2021, with an English translation.
Yang et al., "Copper Conductive Patterns Direct Writing by Ink-Jet Printing", Printed Circuit Information. No. 11. 2009, pp. 29-31, and 35, with an English translation (13 pages total).

CONDUCTIVE FILM AND CONDUCTIVE FILM ROLL, ELECTRONIC PAPER, TOUCH PANEL AND FLAT-PANEL DISPLAY COMPRISING THE SAME

TECHNICAL FIELD

The present invention relates to a conductive film and a conductive film roll, an electronic paper, a touch panel and a flat-panel display comprising the same.

BACKGROUND ART

Transparent conductive films containing indium tin oxide (hereinafter, also referred to as "ITO") have heretofore been used in electronic devices such as electronic papers, touch panels, and flat-panel displays. Larger areas, improved responsiveness, and higher flexibility will be important for much higher-value added electronic devices. Hence, conductive films for use in these devices are required to improve conductivity and flexibility while maintaining their high transmittances.

Since ITO has an inherent low electrical conductivity, making ITO thickness thicker is needed to exert high conductivity although it leads to decline transmittances. Such thicker ITO thicknesses easily causes cracks due to deformation such as bending, deflection, or flexion. It is therefore difficult for conductive films containing ITO to achieve high transmittances, conductivity, and flexibility at the same time.

Accordingly, research and development are actively underway on conductive films serving as an alternative to ITO. Conductive films having a fine metal wire patterned on a transparent substrate have received attention. The fine metal wire has a higher electrical conductivity than that of ITO which is a metal oxide. Conductive films comprising this fine metal wire are expected to exhibit high conductivity. The fine metal wire also has high ductility. The conductive films comprising this fine metal wire are therefore excellent in conductivity and flexibility.

On the other hand, unlike ITO, the fine metal wire itself is opaque and therefore highly visible. However, low visibility and high transmittance need to be achieved by thinning the fine metal wire so as to have a line width of 5 μm or smaller. In this respect, Non Patent Literature 1 discloses a technique of preparing a fine metal wire having a minimum line width of 0.8 μm on a plastic substrate by printing.

A problem of the conductive films comprising the fine metal wire is that reducing conductivity or causing defects are easily occurred by the breaking or peeling from a transparent substrate of the fine metal wire which occurs due to deformation such as bending, deflection, or flexion in handling or device implementing. In response to such a problem, a method of forming a porous layer between a transparent plastic substrate and a fine metal wire pattern, and forming a transparent conductive protective layer on the fine metal wire pattern is known as a method for providing a transparent electrode having a fine metal wire pattern having favorable adhesion to a substrate (see, for example, Patent Literature 1). The porous layer of Patent Literature 1 has pores in the middle of production. However, this porous layer is used as an anchor layer where the pores are filled with ink during fine metal wire formation, and loses the pores in the state of a finally obtained transparent electrode.

Patent Literature 2 discloses, as such a conductive film, a conductive sheet comprising a substrate and a conductive part formed on one principal surface of the substrate, at least the conductive part being bonded to another object via a tackiness agent, wherein the conductive part has a net-like structural part made of a fine metal wire. In this literature, an angle formed by the principal surface of the substrate and the side wall of the fine metal wire is a sharp angle, and the peel tack strength of the conductive part against the tackiness agent falls within a specific range. The resulting conductive sheet can suppress the incorporation of air bubbles to between the conductive sheet and the tackiness agent, can facilitate attachment and reattachment procedures of the tackiness agent, and furthermore, can improve touch panel yields.

CITATION LIST

Non Patent Literature

Non Patent Literature 1: Nature Communications 7, Article number: 11402

Patent Literature

Patent Literature 1: International Publication No. WO 2014/034920

Patent Literature 2: Japanese Patent Laid-Open No. WO 2012-185607

SUMMARY OF INVENTION

Technical Problem

In this context, the line width of the fine metal wire studied in Patent Literature 1 is 10 μm or larger. The studies of the inventors have revealed that in the case of using a fine metal wire having a line width of, for example, 5 μm or smaller in order to improve transparency required for conductive films, even if a porous layer as described in Patent Literature 1 is used, the conductivity of conductive films is disadvantageously reduced due to their deformation such as bending, deflection, or flexion.

The present invention has been made in light of these problems. An object of the present invention is to provide a conductive film that is excellent in flexibility while maintaining its transparency and conductivity, and a conductive film roll, an electronic paper, a touch panel, and a flat-panel display comprising the same.

Solution to Problem

The present inventors have conducted diligent studies and experiments to attain the object. As a result, the present inventors have found that voids are disposed in a fine metal wire, and the ratio of the total cross-sectional area of the voids to the cross-sectional area of the fine metal wire can be adjusted to a specific range, thereby suppressing the breaking or peeling from a transparent substrate of the fine metal wire ascribable to the deformation, such as bending, deflection, or flexion of a conductive film having the fine metal wire, and improving flexibility while maintaining low visibility and high conductivity. The present inventors also have found that when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ can be adjusted to a specific range, thereby more uniformly forming a covering layer such as a protective layer. The present inventors have found that the object mentioned above can be attained by any of these approaches, leading to the completion of the present invention.

The present invention is as follows.

[1]

A conductive film comprising a transparent substrate and a conductive part comprising a fine metal wire pattern disposed on one side or both sides of the transparent substrate, wherein the fine metal wire pattern is constituted by a fine metal wire, and the conductive film satisfies the following condition (i) or (ii):

(i) the fine metal wire has voids, and when the cross-sectional area of the fine metal wire is defined as $S_M$ and the total cross-sectional area of the voids included in the cross-section of the fine metal wire is defined as $S_{Vtotal}$ on the cross-section of the fine metal wire perpendicular to the direction of drawing of the fine metal wire, $S_{Vtotal}/S_M$ is 0.10 or more and 0.40 or less; and (ii) when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ is 0.40 or more and 0.90 or less.

[2]

The conductive film according to [1], wherein $(1+W_{0.90}/W_0) \cdot (1-S_{Vtotal}/S_M)$ is 0.84 or more and 1.71 or less.

[3]

The conductive film according to [1] or [2], wherein the fine metal wire has the voids on the fine metal wire interface on the transparent substrate side.

[4]

The conductive film according to any one of [1] to [3], wherein when the maximum thickness of the fine metal wire is defined as T and the cross-sectional area of the voids in a thickness region from the fine metal wire interface to 0.2T on the transparent substrate side is defined as $S_{V0.2}$, $S_{V0.2}/S_{Vtotal}$ is 0.15 or more and 0.60 or less.

[5]

The conductive film according to any one of [1] to [4], wherein when the maximum thickness of the fine metal wire is defined as T and the cross-sectional area of the voids in a thickness region from the fine metal wire interface to 0.8T on the transparent substrate side is defined as $S_{V0.8}$, $S_{V0.8}/S_{Vtotal}$ is 0.80 or more and 1.00 or less.

[6]

The conductive film according to any one of [1] to [5], wherein $(S_{V0.2}+S_{V0.8})/S_{Vtotal}$ is more than 1.00 and 1.60 or less.

[7]

The conductive film according to any one of [1] to [6], wherein when the width of the fine metal wire at a thickness of 0.50T from the fine metal wire interface on the transparent substrate side is defined as $W_{0.50}$, $W_{0.50}/W_0$ is 0.70 or more and less than 1.00.

[8]

The conductive film according to any one of [1] to [7], wherein $W_{0.90}/W_{0.50}$ is 0.50 or more and 0.95 or less.

[9]

The conductive film according to any one of [1] to [8], wherein $W_{0.50}/W_0$ is larger than $W_{0.90}/W_{0.50}$.

[10]

The conductive film according to any one of [1] to [9], wherein a line width of the fine metal wire is 0.1 μm or larger and 5.0 μm or smaller.

[11]

The conductive film according to any one of [1] to [10], wherein an aspect ratio of the fine metal wire is 0.05 or more and 1.00 or less.

[12]

The conductive film according to any one of [1] to [11], wherein a sheet resistance of the conductive film is 0.1 Ω/sq or more and 1,000 Ω/sq or less.

[13]

The conductive film according to any one of [1] to [12], wherein a visible light transmittance of the conductive film is 80% or more and 100% or less.

[14]

The conductive film according to any one of [1] to [13], wherein a haze of the conductive film is 0.01% or more and 5.00% or less.

[15]

The conductive film according to any one of [1] to [14], wherein an aperture ratio of the fine metal wire pattern is 80% or more and less than 100%.

[16]

The conductive film according to any one of [1] to [15], wherein the fine metal wire pattern is a mesh pattern.

[17]

The conductive film according to any one of [1] to [15], wherein the fine metal wire pattern is a line pattern.

[18]

The conductive film according to any one of [1] to [17], wherein the fine metal wire comprises at least one or more metal elements selected from the group consisting of gold, silver, copper and aluminum.

[19]

The conductive film according to any one of [1] to [18], comprising an intermediate layer between the transparent substrate and the conductive part.

[20]

The conductive film according to [19], wherein the intermediate layer comprises at least one member selected from the group consisting of silicon oxide, silicon nitride, aluminum oxide, and magnesium fluoride.

[21]

The conductive film according to any one of [1] to [20], further comprising a protective layer covering the conductive part.

[22]
A conductive film roll comprising
a conductive film according to any one of [1] to [21] wound into a roll.

[23]
An electronic paper comprising
a conductive film according to any one of [1] to [21].

[24]
A touch panel comprising
a conductive film according to any one of [1] to [21].

[25]
A flat-panel display comprising
a conductive film according to any one of [1] to [21].

Advantageous Effects of Invention

The present invention can provide a conductive film that is excellent in flexibility while maintaining its transparency and conductivity, and a conductive film roll, an electronic paper, a touch panel, and a flat-panel display comprising the same.

DESCRIPTION OF EMBODIMENTS

Figure 1:
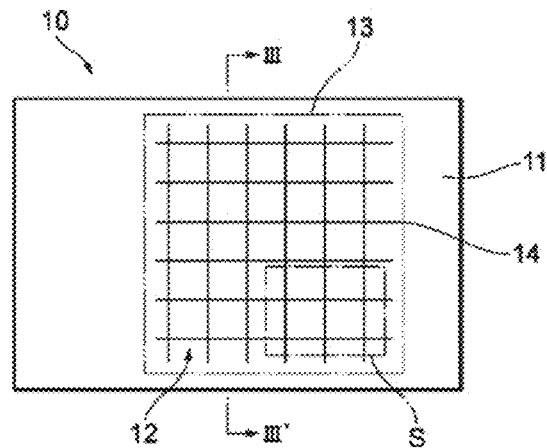
FIG. 1 shows a top view showing one form of the conductive film of the present embodiment having a mesh pattern.

Hereinafter, the mode for carrying out the present invention (hereinafter, referred to as the "present embodiment") will be described in detail. However, the present invention is not limited by the present embodiment, and various changes or modifications can be made therein without departing from the spirit of the present invention. The upper limit value and the lower limit value in each numeric range in the present embodiment can be arbitrarily combined to constitute an arbitrary numeric range. In the drawings, the structure of each part will be appropriately simplified and shown for the sake of convenience of illustration. The dimension, etc. of each part is not limited to the conditions of the drawings.

[Conductive Film]

The conductive film of the present embodiment is a conductive film comprising a transparent substrate and a conductive part comprising a fine metal wire pattern disposed on one side or both sides of the transparent substrate.

The fine metal wire pattern in the conductive film of the present embodiment is constituted by a fine metal wire.

The conductive film of the present embodiment satisfies the following condition (i) or (ii):

(i) the fine metal wire has voids, and when the cross-sectional area of the fine metal wire is defined as $S_M$ and the total cross-sectional area of the voids included in the cross-section of the fine metal wire is defined as $S_{Vtotal}$ on the cross-section of the fine metal wire perpendicular to the direction of drawing of the fine metal wire, $S_{Vtotal}/S_M$ is 0.10 or more and 0.40 or less; and (ii) when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ is 0.40 or more and 0.90 or less.

The conductive film of the present embodiment can provide a conductive film that is excellent in flexibility while maintaining its sufficient transparency and conductivity. The conductive film of the present embodiment can further provide a conductive film that can more uniformly form a covering layer such as a protective layer on fine metal wire surface and can confer functionality such as weather resistance.

Hereinafter, the conductive film of the present embodiment that satisfies the condition (i) will be described as the conductive film of the first embodiment, and the conductive film of the present embodiment that satisfies the condition (ii) will be described as the conductive film of the second embodiment. It should be understood that the conductive film of the present embodiment can satisfy both the conditions (i) and (ii).

For achieving higher conductivity while attaining both effects of improving flexibility by the adjustment of $S_{Vtotal}/S_M$ and being able to uniformly form a covering layer by the adjustment of $W_{0.90}/W_0$, it is desirable to adjust $(1+W_{0.90}/W_0) \cdot (1-S_{Vtotal}/S_M)$ to a specific range. $(1+W_{0.90}/W_0) \cdot (1-S_{Vtotal}/S_M)$ is an indicator that indicates the size of the cross-sectional area of the fine metal wire excluding the voids. $(1+W_{0.90}/W_0) \cdot (1-S_{Vtotal}/S_M)$ is preferably 0.84 or more and 1.71 or less. The lower limit value is more preferably 1.00 or more, further preferably 1.10 or more, particularly preferably 1.15 or more. When $(1+W_{0.90}/W_0) \cdot (1-S_{Vtotal}/S_M)$ is 0.84 or more, conductivity is excellent because of a sufficiently large cross-sectional area of the fine metal wire excluding the voids. On the other hand, when $(1+W_{0.90}/W_0) \cdot (1-S_{Vtotal}/S_M)$ is 1.71 or less, the effects of $S_{Vtotal}/S_M$ and $W_{0.90}/W_0$ mentioned above can be sufficiently exerted. It is preferred to adjust $(1+W_{0.90}/W_0) \cdot (1-S_{Vtotal}/S_M)$ to a larger value from the viewpoint of conductivity. The maximum value of $(1+W_{0.90}/W_0) \cdot (1-S_{Vtotal}/S_M)$ is 2.00, at which the fine metal wire has no void and has a square or rectangular cross-sectional shape.

Increase or decrease in the value of $(1+W_{0.90}/W_0) \cdot (1-S_{Vtotal}/S_M)$ is not particularly limited and can be controlled, for example, by adjusting sintering conditions for forming the fine metal wire. Besides, this value may be adjusted by a method for controlling each value such as $S_{Vtotal}/S_M$ mentioned later. Examples of the method for setting $W_{0.90}/W_0$ in the fine metal wire pattern to within the desired range include the adjustment of ink viscosity using a viscosity adjuster or the like so as to attain a shape within the desired range, and a method of controlling a time from coating of a printing plate or a transfer medium with ink to transfer to a substrate in a pattern formation step, for example, a method of controlling a process time for transferring ink on transfer medium surface to a relief printing plate.

Conductive Film of First Embodiment

The conductive film of the first embodiment comprises a transparent substrate and a conductive part comprising a fine metal wire pattern disposed on one side or both sides of the transparent substrate, wherein the fine metal wire pattern is constituted by a fine metal wire; and the fine metal wire has voids, and when the cross-sectional area of the fine metal wire is defined as $S_M$ and the total cross-sectional area of the voids included in the cross-section of the fine metal wire is defined as $S_{Vtotal}$ on the cross-section of the fine metal wire perpendicular to the direction of drawing of the fine metal wire, $S_{Vtotal}/S_M$ is 0.10 or more and 0.40 or less.

In this context, the line width of the fine metal wire studied in Patent Literature 1 is 10 μm or larger. The studies of the inventors have revealed that in the case of using a fine metal wire having a line width of 5 μm or smaller in order to improve transparency required for conductive films, even if a porous layer as described in Patent Literature 1 is used, the porous layer has an insufficient effect of suppressing reduction in conductivity against the breaking or peeling from transparent substrates of fine metal wires ascribable to the deformation, such as bending, deflection, or flexion, of conductive films.

This is presumably because the fine metal wire having a line width of 5 μm or smaller cannot secure sufficient adhesion of the fine metal wire to a transparent plastic substrate, even if configured as described in Patent Literature 1, due to a small amount of conductive ink penetrating the porous layer and a small contact area between the fine metal wire and the transparent plastic substrate.

The first embodiment has been made in light of these problems. An object of the first embodiment is to provide a conductive film that is excellent in flexibility while maintaining its sufficient transparency and conductivity, and a conductive film roll, an electronic paper, a touch panel, and a flat-panel display comprising the same.

The first embodiment mentioned above can provide a conductive film that is excellent in flexibility while maintaining its sufficient transparency and conductivity, and a conductive film roll, an electronic paper, a touch panel, and a flat-panel display comprising the same.

FIG. 1 shows a top view of the conductive film having a mesh pattern as the fine metal wire pattern, as one form of the conductive film of the present embodiment. Conductive film 10 of the present embodiment has conductive part 13 comprising fine metal wire pattern 12 on transparent substrate 11.

An extraction electrode (not shown) for connection to a controller, etc. may be formed, in addition to the conductive part 13, on the transparent substrate 11 according to the application of use of the conductive film 10. The transparent substrate 11 may have the conductive part 13 on one side or both sides and may have a plurality of conductive parts 13 on one side. The conductive part 13 comprises fine metal wire pattern 12 configured so as to be energizable or chargeable. When the conductive film 10 of the present embodiment is integrated into an electronic device, the conductive part 13 functions as a transparent electrode for the screen portion of an electronic paper, a touch panel, or a flat-panel display, etc.

In such a conductive film, as the line width of the fine metal wire gets thinner, the breaking or peeling from the transparent substrate of the fine metal wire becomes marked due to the bending, deflection, flexion, etc. of the conductive film. Even if the fine metal wire is reinforced by covering the fine metal wire with a protective layer or by improving adhesion with an anchor layer, the mechanical characteristics themselves of the fine metal wire are not changed. Hence, such an approach is not capable of completely solving the flexibility problems of conductive films having a thin fine metal wire.

By contrast, according to the first embodiment, the fine metal wire itself has a configuration provided with voids serving as a cushion part, thereby adjusting the mechanical characteristics of the fine metal wire itself. This enables the flexibility of the fine metal wire to be secured even if a thinner fine metal wire is used from the viewpoint of visibility. Furthermore, such a fine metal wire having voids in a predetermined range is capable of securing flexibility without impairing conductivity. The conductive film comprising such a fine metal wire can be prepared by printing and is therefore also excellent from the viewpoint of cost reduction and reduction in environmental load as compared with a conductive film containing ITO, which involves film formation by a vacuum deposition method or a sputtering method.

[Conductive Part]

The conductive part comprises a fine metal wire pattern constituted by a fine metal wire disposed on the transparent substrate. The fine metal wire pattern may be a regular pattern or an irregular pattern. In the first embodiment, the fine metal wire constituting the fine metal wire pattern has voids at a predetermined proportion on the cross-section of the fine metal wire perpendicular to the direction of drawing of the fine metal wire.

In the first embodiment, $S_{Vtotal}/S_M$ is 0.10 or more and 0.40 or less, preferably 0.13 or more and 0.37 or less, more preferably 0.15 or more and 0.35 or less, further preferably 0.17 or more and 0.33 or less. $S_{Vtotal}/S_M$ is 0.10 or more, whereby the concentration of stress associated with flexion can be relaxed so that flexibility is further improved. $S_{Vtotal}/S_M$ is 0.40 or less, whereby conductivity is further improved and furthermore, the mechanical strength of the fine metal wire is further improved. $S_{Vtotal}$ and $S_M$ can be calculated from an electron microscope photograph of the cross-section of the fine metal wire perpendicular to the direction of drawing of the fine metal wire.

The uneven distribution and even distribution of the voids within the cross-section of the fine metal wire are not particularly limited. The voids may be substantially evenly distributed throughout the cross-section of the fine metal wire, may be unevenly distributed in the fine metal wire interface, for example, on the transparent substrate side, or may be unevenly distributed on the surface side (side opposite to the transparent substrate side) of the fine metal wire. Among others, the fine metal wire preferably has the voids on the fine metal wire interface on the transparent substrate side. Such a configuration tends to further improve flexibility. The phrase "have the voids on the interface" means that "at least some of the voids are in contact with the transparent substrate" and, in the case of having an intermediate layer mentioned later, means that "at least some of the voids are in contact with the intermediate layer".

This principle is not particularly limited and is based on, for example, the following idea: when two members differing in mechanical properties such as rigidity or drawability, i.e., the transparent substrate and the fine metal wire, are deformed by bending, deflection, flexion, etc., as in the conductive film of the first embodiment, stress is focused on the interface therebetween. This may be repeated, thereby causing the breaking or peeling of the fine metal wire. In this case, the presence of the voids on the fine metal wire interface on the transparent substrate side easily relaxes stress and further improves flexibility. It is preferred that the voids should be uniformly distributed on the cross-section of the fine metal wire, from the viewpoint of imparting isotropy to the flexibility of the fine metal wire. From both of these viewpoints, a form is preferred in which the fine metal wire has the voids on the fine metal wire interface on the transparent substrate side while some of the voids are distributed within the cross-section of the fine metal wire.

The uneven distribution and the even distribution can be represented by the cross-sectional area of the voids in a specific thickness region. For example, when the cross-sectional area of the voids in a thickness region from the fine metal wire interface to 0.2T on the transparent substrate side is defined as $S_{V0.2}$, $S_{V0.2}/S_{Vtotal}$ serves as an indicator that indicates the proportion of the voids present in a region on the interface side of the fine metal wire on the transparent substrate side. Such $S_{V0.2}/S_{Vtotal}$ is preferably 0.15 or more and 0.60 or less, more preferably 0.18 or more and 0.55 or less, further preferably 0.20 or more and 0.50 or less. $S_{V0.2}/S_{Vtotal}$ is 0.15 or more, whereby stress on the fine metal wire interface on the transparent substrate side is more likely to be relaxed so that flexibility tends to be further improved. $S_{V0.2}/S_{Vtotal}$ is 0.60 or less, whereby a large contact area between the transparent substrate and the fine metal wire further improves adhesion while a relatively large proportion of the voids present in other regions tends to further improve isotropic flexibility. In the present embodiment, T denotes the maximum thickness among thicknesses from the fine metal wire interface on the transparent substrate side to the fine metal wire surface and can be measured from an electron microscope photograph.

When the cross-sectional area of the voids in a thickness region from the fine metal wire interface to 0.8T on the transparent substrate side is defined as $S_{V0.8}$, $S_{V0.8}/S_{Vtotal}$ serves as an indicator that indicates the proportion of the voids present in regions other than the surface side of the fine metal wire. Such $S_{V0.8}/S_{Vtotal}$ is preferably 0.80 or more and 1.00 or less. The lower limit value is more preferably 0.85 or more, further preferably 0.90 or more. $S_{V0.8}/S_{Vtotal}$ is 0.80 or more, whereby stress on the fine metal wire interface on the transparent substrate side is more likely to be relaxed so that flexibility tends to be further improved. Also, conductivity tends to be improved.

As described above, $S_{Vtotal}/S_M$ and preferably further $S_{V0.2}/S_{Vtotal}$ and $S_{V0.8}/S_{Vtotal}$ can be adjusted to specific ranges, thereby suppressing the breaking or peeling from a transparent substrate of the fine metal wire ascribable to the deformation, such as bending, deflection, or flexion, of the conductive film, and improving flexibility while maintaining low visibility and high conductivity.

$(S_{V0.2}+S_{V0.8})/S_{Vtotal}$ is an indicator that indicates the degree of uneven distribution of the voids on the interface side (thickness region from the fine metal wire interface to 0.2T on the transparent substrate side) of the fine metal wire with respect to the surface side (thickness region from 0.8T to T) of the fine metal wire. The presence of the voids on the interface side of the fine metal wire, i.e., in a thickness region from the fine metal wire interface to 0.2T, and $(S_{V0.2}+S_{V0.8})/S_{Vtotal}$ of more than 1.00 indicate that the voids are more unevenly distributed on the interface side than the surface side of the fine metal wire. $(S_{V0.2}+S_{V0.8})/S_{Vtotal}$ is preferably more than 1.00 and 1.60 or less, more preferably 1.10 or more and 1.55 or less, further preferably 1.15 or more and 1.50 or less. When $(S_{V0.2}+S_{V0.8})/S_{Vtotal}$ is more than 1.00, stress on the fine metal wire interface on the transparent substrate side is more likely to be relaxed so that flexibility tends to be further improved because the voids are unevenly distributed on the interface side of the fine metal wire. When $(S_{V0.2}+S_{V0.8})/S_{Vtotal}$ is 1.60 or less, a relatively large proportion of the voids present in regions other than the interface tends to further improve isotropic flexibility. The maximum value of $(S_{V0.2}+S_{V0.8})/S_{Vtotal}$ is 2.00, at which all the voids exist in a thickness region from the fine metal wire interface to 0.2T on the transparent substrate side.

Increase or decrease in each value of $S_{Vtotal}/S_M$, $S_{V0.2}/S_{Vtotal}$, $S_{V0.8}/S_{Vtotal}$, and $(S_{V0.2}+S_{V0.8})/S_{Vtotal}$ is not particularly limited and can be controlled, for example, by adjusting sintering conditions for forming the fine metal wire. The fine metal wire can be formed by forming a pattern using ink containing a metal component on the transparent substrate, and sintering the pattern for the binding of the metal components to another. In this sintering step, the metal component is considered to form a metal component sintered film by fusion to an adjacent metal component while diffused and aggregated. Hence, the diffusion and aggregation of the metal component are adjusted by adjusting an energy at the time of sintering (e.g., heat, plasma, electron beam, and irradiation energy of a light source) or a sintering time. This can adjust the amount of the voids in the fine metal wire. The amount of the voids in the fine metal wire may also be adjusted by adjusting the type or content of a surfactant, a dispersant, or a reducing agent contained in the ink, and generating their decomposed gases during sintering.

In the present specification, $S_{Vtotal}/S_M$, $S_{V0.2}/S_{Vtotal}$, $S_{V0.8}/S_{Vtotal}$ and $(S_{V0.2}\ S_{V0.8})/S_{Vtotal}$ can be calculated from an electron microscope photograph of the cross-section of the fine metal wire perpendicular to the direction of drawing of the fine metal wire. Hereinafter, specific measurement methods will be described. The formation of the cross-section of the fine metal wire or SEM observation mentioned later is preferably performed in an inert atmosphere of argon or the like or in vacuum from the viewpoint of preventing the oxidation or contamination of the fine metal wire cross-section.

First, the conductive film is cut to obtain a measurement sample including the cross-section of the fine metal wire perpendicular to the direction of drawing of the fine metal wire. The method for preparing the measurement sample is not particularly limited as long as the method can suppress damage (deformation) on the fine metal wire cross-section ascribable to the formation or processing of the cross-section. Preferably, a processing method using ion beam (e.g., BIB (broad ion beam) and FIB (focused ion beam) processing methods), precision machine polishing, an ultra-microtome, or the like can be used. Particularly, a BIB processing method using argon ion beam is preferably used from the viewpoint of suppressing damage on the fine metal wire cross-section. In the present embodiment and Examples, a BIB processing method is used.

Hereinafter, the method for forming the cross-section of the fine metal wire by use of the BIB processing method will be described. First, the conductive film is cut perpendicularly to the direction of drawing of the fine metal wire to obtain a sample having an exposed cross-section to be observed. In this operation, the cross-section of the sample might have undergone slight deformation due to the cutting process. Accordingly, in the BIB processing method, this cross-section that might have undergone slight deformation is trimmed with broad ion beam to obtain a fine cross-section without deformation. Specifically, first, a shielding plate is closely attached to the surface of the transparent substrate on the side where no conductive part is formed, of the sample. In this operation, the shielding plate is closely attached to the sample so as to expose a portion to be trimmed with broad ion beam and so as not to expose other portions. Subsequently, the sample is irradiated with broad ion beam from above the shielding plate. The exposed portion (cross-section that might have undergone deformation) is thereby trimmed with broad ion beam to obtain a measurement sample having a cross-section without deformation. The irradiation with broad ion beam from the transparent substrate side can produce a finer cross-section of the fine metal wire as compared with irradiation with broad ion beam from the conductive part side.

Alternatively, the conductive film may be cut directly with broad ion beam when cut perpendicularly to the direction of drawing of the fine metal wire. In this case, the shielding plate is closely attached to the side of the transparent substrate where no conductive part is formed in the conductive film. The sample is irradiated with broad ion beam from above the shielding plate.

The measurement sample thus obtained is observed under SEM to obtain an SEM image of the cross-section of the fine metal wire. $S_M$, $S_{Vtotal}$, $S_{V0.2}$ and $S_{V0.8}$ are each calculated from the obtained SEM image, and $S_{Vtotal}/S_M$, $S_{V0.2}/S_{Vtotal}$, $S_{V0.8}/S_{Vtotal}$, and $(S_{V0.2}+S_{V0.8})/S_{Vtotal}$ can be calculated. The cross-sectional area $S_M$ of the fine metal wire is a total cross-sectional area including the structure and the voids of the fine metal wire cross-section mentioned above.

For the calculation of $S_{Vtotal}/S_M$, $S_{V0.2}/S_{Vtotal}$, $S_{V0.8}/S_{Vtotal}$ and $(S_{V0.2}+S_{V0.8})/S_{Vtotal}$ image processing software known in the art, such as IP-1000 manufactured by Asahi Kasei Corp. (software name: A-zo Kun) or ImageJ, may be supplementarily used. In the present embodiment and Examples, ImageJ was used.

The fine metal wire preferably has, for example, but not particularly limited to, a conductive component containing at least one or more metal elements selected from the group consisting of gold, silver, copper, and aluminum. Particularly, the conductive component is preferably composed mainly of silver or copper from the viewpoint of cost and conductivity and more preferably composed mainly of copper from the viewpoint of cost. In the present embodiment, the phrase "composed mainly of" means being composed of 50% by mass or more of the component.

The fine metal wire may comprise a non-conductive component in addition to the conductive component. Examples of the non-conductive component include, but are not particularly limited to, metal oxides, metal compounds, and organic compounds. Examples of these non-conductive components include metal oxides, metal compounds, and organic compounds that are components derived from components contained in ink mentioned later and remain in the fine metal wire after sintering among the components contained in ink. The content ratio of the conductive component is preferably 50% by mass or more, more preferably 60% by mass or more, further preferably 70% by mass or more. The upper limit of the content ratio of the conductive component is not particularly limited and is 100% by mass. The content ratio of the non-conductive component is preferably 50% by mass or less, more preferably 40% by mass or less, further preferably 30% by mass or less. The lower limit of the content ratio of the non-conductive component is not particularly limited and is 0% by mass.

(Fine Metal Wire Pattern)

Figure 2:
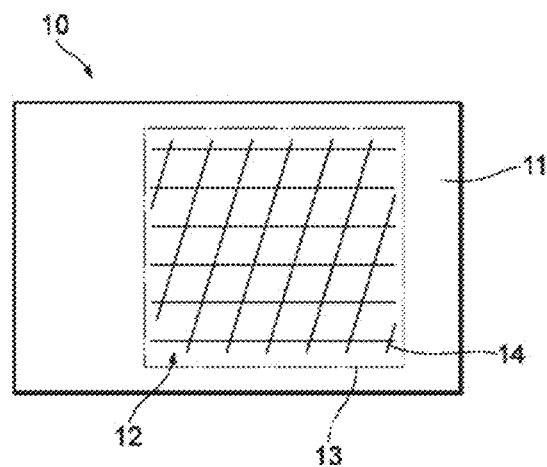
FIG. 2 shows a top view showing another form of the conductive film of the present embodiment having a mesh pattern.
Figure 3:
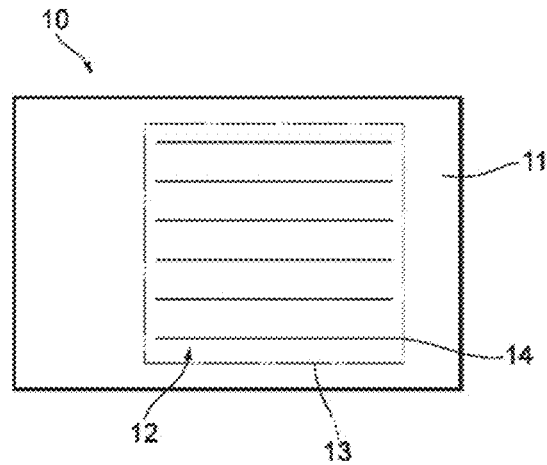
FIG. 3 shows a top view showing one form of the conductive film of the present embodiment having a line pattern.
Figure 4:
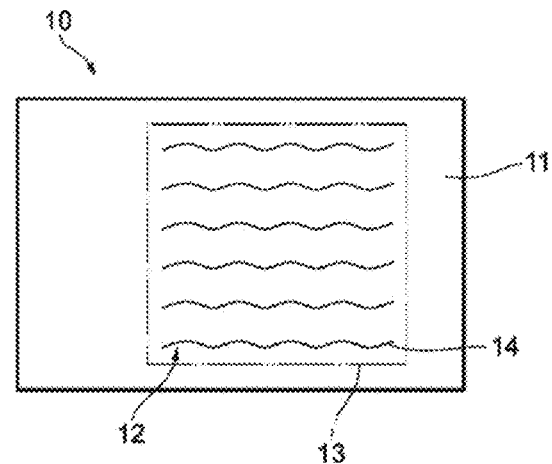
FIG. 4 shows a top view showing another form of the conductive film of the present embodiment having a line pattern.

The fine metal wire pattern can be designed according to the application of an intended electronic device. Examples thereof include, but are not particularly limited to, a mesh pattern (FIGS. 1 and 2) formed by a plurality of lines of the fine metal wire intersecting in a net-like form, and a line pattern (FIGS. 3 and 4) formed by a plurality of substantially parallel lines of the fine metal wire. Alternatively, the fine metal wire pattern may be a combination of the mesh pattern and the line pattern. The mesh of the mesh pattern may have a square or rectangular shape as shown in FIG. 1 or may have a polygonal shape such as a rhombus as shown in FIG. 2. The fine metal wire constituting the line pattern may be a straight line as shown in FIG. 3 or may be a curved line as shown in FIG. 4. The fine metal wire constituting the mesh pattern can also be a curved line.

Figure 5:
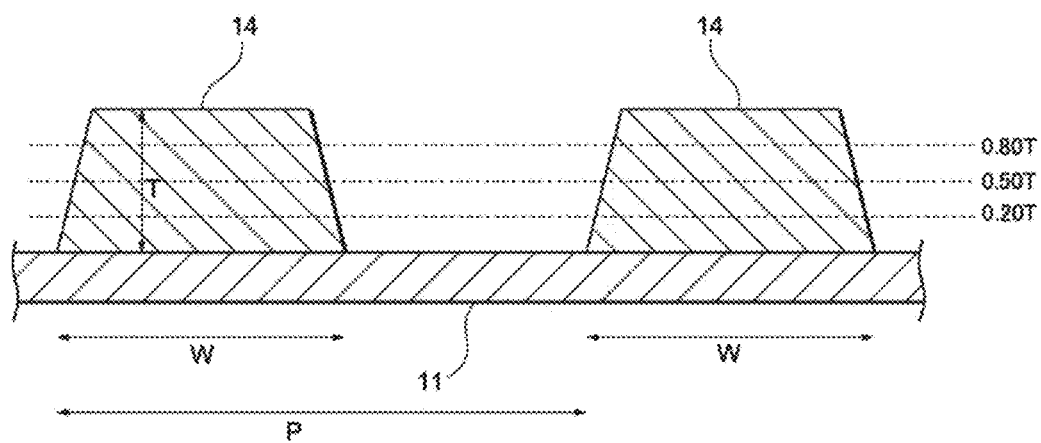
FIG. 5 shows a partial cross-sectional view taken along the III-III' line in the conductive film of FIG. 1.

Line width W of the fine metal wire of the present embodiment refers to the line width of the fine metal wire 14 when the fine metal wire 14 is projected onto the surface of the transparent substrate 11 from the side where the fine metal wire pattern 12 is disposed, of the transparent substrate 11. FIG. 5 shows a partial cross-sectional view taken along the III-III' line in the conductive film of FIG. 1. Referring to this FIG. 5, the line width W of fine metal wire 14 having a trapezoidal cross-section is the width on the side contacted with the transparent substrate 11, of the fine metal wire 14. The thickness T of the fine metal wire means the maximum thickness when surface roughness is taken into consideration. Pitch P means the sum of the line width W and the distance between lines of the fine metal wire.

(Line Width W)

The line width W of the fine metal wire is preferably 0.1 µm or larger and 5.0 µm or smaller, more preferably 0.2 µm or larger and 4.0 µm or smaller, further preferably 0.3 µm or larger and 3.0 µm or smaller, still further preferably 0.4 µm or larger and 2.5 µm or smaller. The line width W of the fine metal wire is 0.1 µm or larger, whereby conductivity tends to be further improved. Furthermore, reduction in conductivity ascribable to the oxidation, corrosion, or the like of the fine metal wire surface tends to be able to be sufficiently suppressed. A thinner line width of the fine metal wire permits increase in the number of lines of the fine metal wire at the same aperture ratio. This attains more uniform electrical field distribution of the conductive film so that this enables a higher-resolution electronic device to be fabricated. If some lines of the fine metal wire are broken, this influence can be compensated for by the other lines of the fine metal wire. On the other hand, the line width W of the fine metal wire is 5.0 μm or smaller, whereby the visibility of the fine metal wire is further reduced. Thus, the transparency of the conductive film tends to be further improved.

The thickness T of the fine metal wire is preferably 10 nm or larger and 1,000 nm or smaller. The lower limit of the thickness T is more preferably 50 nm or larger, further preferably 75 nm or larger. The thickness T of the fine metal wire is 10 nm or larger, whereby conductivity tends to be further improved. Reduction in conductivity ascribable to the oxidation, corrosion, or the like of the fine metal wire surface tends to be able to be sufficiently suppressed. On the other hand, the thickness T of the fine metal wire is 1,000 nm or smaller, whereby high transparency can be exerted in a wide view angle.

(Aspect Ratio)

The aspect ratio represented by the thickness T of the fine metal wire to the line width W of the fine metal wire is preferably 0.05 or more and 1.00 or less. The lower limit of the aspect ratio is more preferably 0.08 or more, further preferably 0.10 or more. The aspect ratio is 0.05 or more, whereby conductivity tends to be able to be further improved without reducing transmittances.

(Pitch)

The pitch P of the fine metal wire pattern is preferably 5 μm or larger, more preferably 50 μm or larger, further preferably 100 μm or larger. The pitch P of the fine metal wire pattern is 5 μm or larger, whereby a favorable transmittance can be obtained. The pitch P of the fine metal wire pattern is preferably 1,000 μm or smaller, more preferably 500 μm or smaller, further preferably 250 μm or smaller. The pitch P of the fine metal wire pattern is 1,000 μm or smaller, whereby conductivity tends to be able to be further improved. When the shape of the fine metal wire pattern is a mesh pattern, an aperture ratio of 99% can be attained by setting the pitch to 200 μm of a fine metal wire pattern having a line width of 1 μm.

The line width, aspect ratio, and pitch of the fine metal wire pattern can be confirmed by observing the conductive film cross-section under an electron microscope or the like. The line width and pitch of the fine metal wire pattern can also be observed under a laser microscope or an optical microscope. Since the pitch and the aperture ratio have a relational expression mentioned later, one of these factors can be calculated if the other factor is known. Examples of the method for adjusting the line width, aspect ratio, and pitch of the fine metal wire pattern to the desired ranges include a method of adjusting grooves of a printing plate for use in a method for producing the conductive film mentioned later, and a method of adjusting the average particle size of metal particles in ink.

(Aperture Ratio)

The lower limit value of the aperture ratio of the fine metal wire pattern is preferably 60% or more, more preferably 70% or more, further preferably 80% or more, particularly preferably 90% or more. The aperture ratio of the fine metal wire pattern is equal to or more than the specific value mentioned above, whereby the transmittance of the conductive film tends to be further improved. The upper limit value of the aperture ratio of the fine metal wire pattern is preferably less than 100%, more preferably 95% or less, further preferably 90% or less, still further preferably 80% or less, even further preferably 70% or less, particularly preferably 60% or less. The aperture ratio of the fine metal wire pattern is equal to or less than the specific value mentioned above, whereby the conductivity of the conductive film tends to be further improved. The aperture ratio of the fine metal wire pattern also differs in appropriate value depending on the shape of the fine metal wire pattern. The upper limit value and lower limit value of the aperture ratio of the fine metal wire pattern can be appropriately combined according to the required performance (transmittance and sheet resistance) of an intended electronic device.

The "aperture ratio of the fine metal wire pattern" can be calculated according to an expression given below as to a region where the fine metal wire pattern is formed on the transparent substrate. The region where the fine metal wire pattern is formed on the transparent substrate is a range represented by S in FIG. 1 and excludes a marginal part and the like where the fine metal wire pattern is not formed.

$$\text{Aperture ratio} = (1 - \text{Area occupied by the fine metal wire pattern}/\text{Area of the transparent substrate}) \times 100$$

Figure 6:
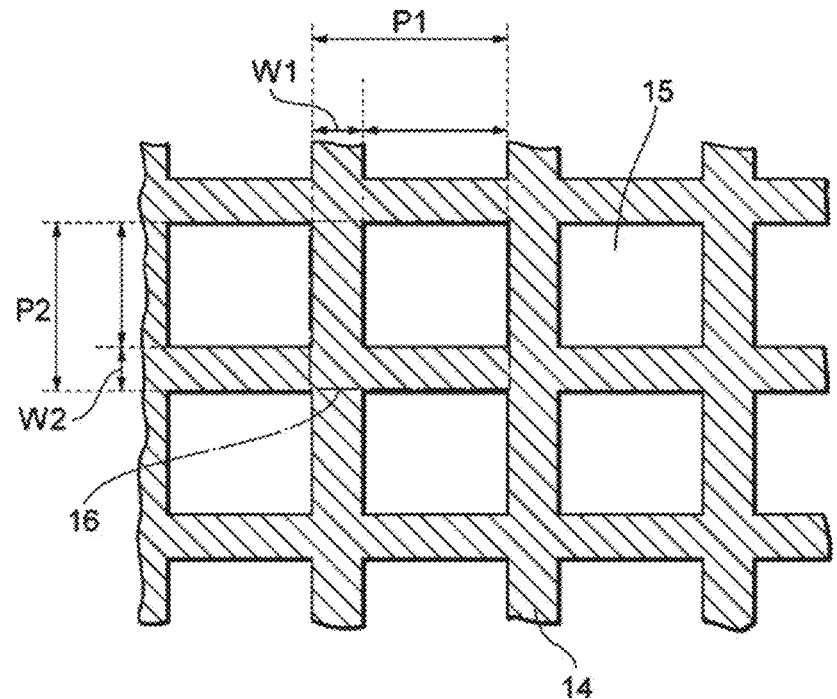
FIG. 6 shows a top view of a fine metal wire pattern for illustrating the relationship between the aperture ratio and the pitch of the conductive film of the present embodiment having a mesh pattern.

The relational expression of the aperture ratio and the pitch differs depending on the shape of the fine metal wire pattern. Their relationship can be calculated as given below. FIG. 6 shows a schematic view of a mesh pattern (grid pattern) having pattern unit 16. In the case of this mesh pattern, the aperture ratio and the pitch have the following relational expression:

$$\text{Aperture ratio} = \{\text{Area of opening part 15}/\text{Area of pattern unit 16}\} \times 100 = \{((\text{Pitch } P1 - \text{Line width } W1) \times (\text{Pitch } P2 - \text{Line width } W2))/(\text{Pitch } P1 \times \text{Pitch } P2)\} \times 100$$

Figure 7:
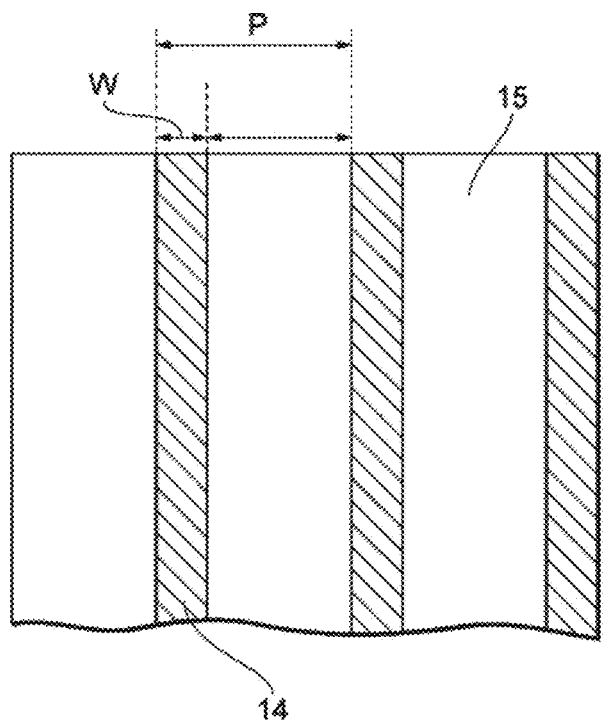
FIG. 7 shows a top view of a fine metal wire pattern for illustrating the relationship between the aperture ratio and the pitch of the conductive film of the present embodiment having a line pattern.

FIG. 7 shows a schematic view of a line pattern. In the case of this line pattern, the aperture ratio and the pitch have the following relational expression:

$$\text{Aperture ratio} = \{(\text{Pitch } P - \text{Line width } W)/\text{Pitch } P\} \times 100$$

(Sheet Resistance)

The sheet resistance of the conductive film is preferably 0.1 Ω/sq or more and 1,000 Ω/sq or less, more preferably 0.1 Ω/sq or more and 500 Ω/sq or less, further preferably 0.1 Ω/sq or more and 300 Ω/sq or less, still further preferably 0.1 Ω/sq or more and 200 Ω/sq or less, even further preferably 0.1 Ω/sq or more and 100 Ω/sq or less, even further preferably 0.1 Ω/sq or more and 20 Ω/sq or less, even further preferably 0.1 Ω/sq or more and 10 Ω/sq or less. A lower sheet resistance tends to suppress power loss. Hence, an electronic paper, a touch panel, and a flat-panel display having less power consumption can be obtained by using the conductive film having a low sheet resistance. The sheet resistance of the conductive film can be measured by a method given below.

Figure 15:
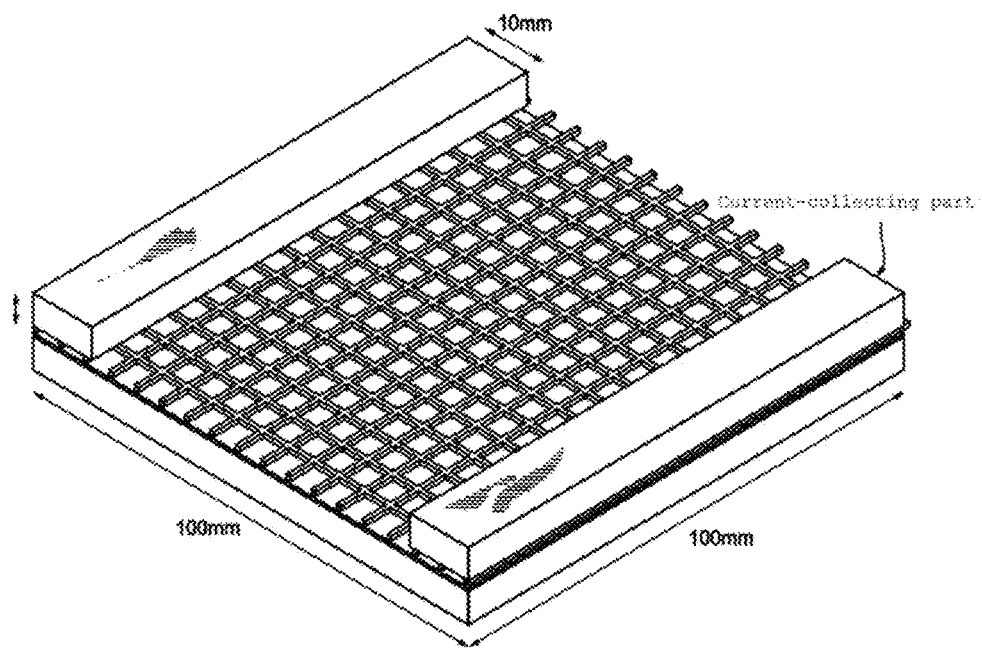
FIG. 15 shows a perspective view for illustrating a method for measuring a sheet resistance.

FIG. 15 shows a perspective view for illustrating the method for measuring the sheet resistance. First, a rectangular portion throughout which the fine metal wire pattern is disposed is cut out of the conductive film to obtain a measurement sample. Current collector parts for sheet resistance measurement electrically connected to the fine metal wire pattern are formed at both ends of the obtained measurement sample. Electrical resistance R (Ω) between the current collector parts is measured. Sheet resistance $R_s$ (Ω/sq) can be calculated according to the following expression from the obtained electrical resistance R (Ω), distance L (mm) between the current collector parts of the measurement sample, and length D (mm) in the depth direction.

$$R_s = R/L \times D$$

The sheet resistance of the conductive film tends to be reduced with increase in the aspect ratio (thickness) of the fine metal wire. The sheet resistance may be adjusted by selecting the type of the metal material constituting the fine metal wire.

A lower sheet resistance tends to suppress power loss. Hence, an electronic paper, a touch panel, and a flat-panel display having less power consumption can be obtained.

(Visible Light Transmittance)

The visible light transmittance of the conductive film is preferably 80% or more and 100% or less, more preferably 90% or more and 100% or less. In this context, the visible light transmittance can be measured in accordance with JIS K 7361-1: 1997 for total light transmittance by calculating the transmittance in a range of the visible light (360 to 830 nm).

The visible light transmittance of the conductive film tends to be further improved by decreasing the line width of the fine metal wire pattern or by increasing the aperture ratio thereof.

(Haze)

The haze of the conductive film is preferably 0.01% or more and 5.00% or less. The upper limit of the haze is more preferably 3.00% or less, further preferably 1.00% or less. When the upper limit of the haze is 5.00% or less, the cloudiness of the conductive film to visible light can be sufficiently reduced. The haze described herein can be measured in accordance with JIS K 7136: 2000 for haze.

[Transparent Substrate]

The term "transparent" of the transparent substrate means that the visible light transmittance is preferably 80% or more, more preferably 90% or more, further preferably 95% or more. In this context, the visible light transmittance can be measured in accordance with JIS K 7361-1: 1997.

Examples of the material of the transparent substrate include, but are not particularly limited to: transparent inorganic substrates such as glass; and transparent organic substrates such as acrylic acid ester, methacrylic acid ester, polyethylene terephthalate, polybutylene terephthalate, polyethylene naphthalate, polycarbonate, polyarylate, polyvinyl chloride, polyethylene, polypropylene, polystyrene, nylon, aromatic polyamide, polyether ether ketone, polysulfone, polyethersulfone, polyimide, and polyetherimide. Among them, polyethylene terephthalate, polyimide, or polyethylene naphthalate is preferred. Use of polyethylene terephthalate attains better productivity (cost reduction effect) for producing the conductive film and tends to further improve the adhesion of the transparent substrate to the fine metal wire. Use of polyimide tends to further improve the heat resistance of the conductive film. Use of polyethylene naphthalate tends to attain better adhesion of the transparent substrate to the fine metal wire.

The transparent substrate may be made of one material or may be made of two or more materials laminated with each other. When the transparent substrate is multi-layered such that two or more materials are laminated with each other, the transparent substrate may be made of organic substrates or inorganic substrates laminated with each other or may be made of an organic substrate(s) and an inorganic substrate(s) laminated with each other.

The thickness of the transparent substrate is preferably 5 µm or larger and 500 µm or smaller, more preferably 10 µm or larger and 100 µm or smaller.

[Intermediate Layer]

The conductive film of the present embodiment may have an intermediate layer between the transparent substrate and the conductive part. The intermediate layer is capable of contributing to improvement in the adhesion between the transparent substrate and the fine metal wire of the conductive part.

Examples of the component contained in the intermediate layer include, but are not particularly limited to: silicon compounds such as (poly)silanes, (poly)silazanes, (poly)silthianes, (poly)siloxanes, silicon, silicon carbide, silicon oxide, silicon nitride, silicon chloride, silicate, zeolite, and silicide; aluminum compounds such as aluminum oxide; and magnesium compounds such as magnesium fluoride. Among them, at least one member selected from the group consisting of silicon oxide, silicon nitride, aluminum oxide, and magnesium fluoride is preferred. Use of such a component tends to further improve the transparency and durability of the conductive film and attains better productivity (cost reduction effect) for producing the conductive film. The intermediate layer can be prepared by a vapor deposition such as PVD or CVD, or a film formation method of applying and drying an intermediate layer-forming composition containing the component of the intermediate layer dispersed in a dispersion medium. The intermediate layer-forming composition may contain, if necessary, a dispersant, a surfactant, a binder, or the like.

The thickness of the intermediate layer is preferably 0.01 µm or larger and 500 µm or smaller, more preferably 0.05 µm or larger and 300 µm or smaller, further preferably 0.10 µm or larger and 200 µm or smaller. The thickness of the intermediate layer is 0.01 µm or larger, whereby the adhesion of the intermediate layer to the fine metal wire is exerted. The thickness of the intermediate layer is 500 µm or smaller, whereby the flexibility of the transparent substrate can be ensured.

The intermediate layer laminated on the transparent substrate can prevent plasma or the like from etching the transparent substrate at a site uncovered with the fine metal wire pattern part when a metal component in ink is sintered by a sintering process such as plasma.

This intermediate layer preferably further has an antistatic function in order to prevent the breaking of the fine metal wire pattern ascribable to static electricity. For the intermediate layer having an antistatic function, it is preferred that the intermediate layer should comprise at least any of a conductive inorganic oxide and a conductive organic compound. Examples of the conductive organic compound include conductive organosilane compounds, aliphatic conjugated polyacetylene, aromatic conjugated poly(p-phenylene), and heterocyclic conjugated polypyrrole. Among them, a conductive organosilane compound is preferred.

The volume resistivity of the intermediate layer is preferably 100 Ωcm or more and 100000 Ωcm or less, more preferably 1000 Ωcm or more and 10000 Ωcm or less, still more preferably 2000 Ωcm or more and 8000 Ωcm or less. The volume resistivity of the intermediate layer is 100000 Ωcm or less, whereby an antistatic function is exerted. The volume resistivity of the intermediate layer is 100 Ωcm or more, whereby the resulting conductive film can be suitably used for applications such as touch panels for which electrical conduction between fine metal wire patterns is undesirable. The volume resistivity can be adjusted by the content of the component, such as the conductive inorganic oxide or the conductive organic compound, which exerts an antistatic function, in the intermediate layer. When the intermediate layer comprises, for example, highly plasma-resistant silicon oxide (volume specific resistance: $10^{14}$ $\Omega \cdot cm$ or more) and an organosilane compound as the conductive organic compound, the volume resistivity can be reduced by increasing the content of the conductive organosilane compound. On the other hand, the thin intermediate layer can be formed not to impair optical characteristics by increasing the content of the silicon oxide because of its high plasma resistance, although the volume resistivity is increased.

[Protective Layer]

The conductive film of the first embodiment may be provided with a protective layer covering the conductive part. The protective layer may cover only the fine metal wire constituting the conductive part or may cover the surface of the fine metal wire and the transparent substrate (or the intermediate layer).

The material of the protective layer is not particularly limited as long as the material has translucency and can exert favorable adhesion to the fine metal wire or the transparent substrate (or the intermediate layer). For example, a thermosetting resin such as phenol resin, thermosetting epoxy resin, thermosetting polyimide, melamine resin, urea resin, unsaturated polyester resin, alkyd resin, polyurethane, diallyl phthalate resin, or silicone resin, a UV curable resin such as urethane acrylate, acrylic resin acrylate, epoxy acrylate, silicone acrylate, or UV curable epoxy resin, or a commercially available coating agent can be used.

The thickness of the protective layer is preferably 0.01 μm or larger and 1.00 μm or smaller, more preferably 0.03 μm or larger and 0.80 μm or smaller, further preferably 0.05 μm or larger and 0.50 μm or smaller. The thickness of the protective layer is 0.01 μm or larger, whereby the fine metal wire protected with the protective layer can be prevented from being oxidized. The thickness of the protective layer is 1.00 μm or smaller, whereby the transparency of the conductive film can be improved.

[Method for Producing Conductive Film]

Examples of the method for producing the conductive film of the present embodiment include, but are not particularly limited to, a method having a pattern formation step of forming a pattern on a transparent substrate using ink containing a metal component, and a sintering step of sintering the pattern to form a fine metal wire. The method for producing the conductive film of the present embodiment may also comprise an intermediate layer formation step of forming an intermediate layer on the surface of the transparent substrate, prior to the pattern formation step.

[Intermediate Layer Formation Step]

The intermediate layer formation step is the step of forming an intermediate layer on the surface of the transparent substrate. Examples of the method for forming the intermediate layer include, but are not particularly limited to: a method of forming a vapor-deposited film on the transparent substrate surface by a vapor deposition such as physical vapor deposition (PVD) or chemical vapor deposition (CVD); a method of forming a coating film by applying a composition for intermediate layer formation onto the transparent substrate surface, followed by drying.

The composition for intermediate layer formation contains any of the components listed as examples of the component contained in the intermediate layer, or a precursor thereof, and a solvent and may contain, if necessary, a surfactant, a dispersant, a binder, or the like.

[Pattern Formation Step]

The pattern formation step is the step of forming a pattern using ink containing a metal component. The pattern formation step is not particularly limited as long as the step is performed by a plate printing method using a printing plate having grooves of the desired fine metal wire pattern. Such a method has, for example, the steps of: coating transfer medium surface with ink; allowing the transfer medium surface coated with ink to face the protruding portion surface of a relief printing plate, and pressing and contacting these surfaces to transfer the ink on the transfer medium surface onto the protruding portion surface of the relief printing plate; and allowing the transfer medium surface coated with ink to face the surface of the transparent substrate, and pressing and contacting these surfaces to transfer the ink remaining on the transfer medium surface to the surface of the transparent substrate. When the intermediate layer is formed on the transparent substrate, the ink is transferred to the intermediate layer surface.

(Ink)

The ink for use in the pattern formation step contains a metal component, and a solvent and may contain, if necessary, a surfactant, a dispersant, a reducing agent, or the like. The metal component may be contained as metal particles in the ink or may be contained as a metal complex in the ink. In this context, examples of the metal element species contained in the metal component include, but are not particularly limited to, gold, silver, copper, and aluminum. Among them, silver or copper is preferred, and copper is more preferred.

In the case of using metal particles, their average primary particle size is preferably 100 nm or smaller, more preferably 50 nm or smaller, further preferably 30 nm or smaller. The lower limit of the average primary particle size of the metal particles is not particularly limited and is, for example, 1 nm or larger. The average primary particle size of the metal particles is 100 nm or smaller, whereby the line width W of the resulting fine metal wire can be further thinned. In the present embodiment, the "average primary particle size" refers to the particle size of each individual metal particle (so-called primary particle) and is distinguished from an average secondary particle size which is the particle size of an aggregate (so-called secondary particle) formed by a plurality of metal particles together.

The metal particles may be in the form of a metal oxide such as copper oxide, a metal compound, or core/shell particles having copper in the core part and copper oxide in the shell part. The form of the metal particles can be appropriately determined from the viewpoint of dispersibility and sinterability.

The content of the metal particles in the ink is preferably 1% by mass or more and 40% by mass or less, more preferably 5% by mass or more and 35% by mass or less, further preferably 10% by mass or more and 35% by mass or less, based on the total mass of the ink composition. When the content of the metal particles in the ink is 1% by mass or more based on the total mass of the ink composition, a fine metal wire pattern having conductivity can be obtained. When the content is 40% by mass or less, the ink can be printed in the fine metal wire pattern.

Examples of the surfactant include, but are not particularly limited to, silicone surfactants and fluorine surfactants. Use of such a surfactant improves the coatability of a transfer medium (blanket) with the ink and the smoothness of the ink used in coating and tends to produce a more uniform coating film. The surfactant is preferably configured so as to permit dispersion of the metal component and to be less likely to remain in sintering.

The content of the surfactant in the ink is preferably 0.01% by mass or more and 10% by mass or less, more preferably 0.1% by mass or more and 5% by mass or less, further preferably 0.5% by mass or more and 2% by mass or less, based on the total mass of the ink composition. When the content of the surfactant in the ink is 0.01% by mass or more based on the total mass of the ink composition, coatability with the ink and the smoothness of the ink used in coating can be improved. When the content is 10% by mass or less, a low resistant fine metal wire pattern can be obtained.

Examples of the dispersant include, but are not particularly limited to, a dispersant that noncovalently binds to or interacts with the metal component, and a dispersant that covalently binds to the metal component. Examples of the functional group for noncovalent binding or interaction include dispersants having a phosphoric acid group. Use of such a dispersant tends to further improve the dispersibility of the metal component.

The content of the dispersant in the ink is preferably 0.1% by mass or more and 30% by mass or less, more preferably 1% by mass or more and 20% by mass or less, further preferably 2% by mass or more and 10% by mass or less, based on the total mass of the ink composition. When the content of the dispersant in the ink is 0.1% by mass or more based on the total mass of the ink composition, ink containing the metal particles dispersed therein can be obtained. When the content is 30% by mass or less, a low resistant fine metal wire pattern can be obtained.

Examples of the solvent include: alcohol solvents such as monoalcohols and polyalcohols; alkyl ether solvents; hydrocarbon solvents; ketone solvents; and ester solvents. These solvents may be used singly, or one or more thereof may be used in combination. For example, a monoalcohol having 10 or less carbon atoms and a polyalcohol having 10 or less carbon atoms are used in combination. Use of such a solvent tends to further improve the coatability of a transfer medium (blanket) with the ink, the transferability of the ink from a transfer medium to a relief printing plate, the transferability of the ink from the transfer medium to the transparent substrate, and the dispersibility of the metal component. The solvent is preferably configured so as to permit dispersion of the metal component and to be less likely to remain in sintering.

The content of the solvent in the ink is a balance of the components such as the metal particles, the surfactant, and the dispersant mentioned above and is, for example, preferably 50% by mass or more and 99% by mass or less, more preferably 60% by mass or more and 90% by mass or less, further preferably 70% by mass or more and 80% by mass or less, based on the total mass of the ink composition. When the content of the solvent in the ink is 50% by mass or more based on the total mass of the ink composition, the ink can be printed in the fine metal wire pattern. When the content is 99% by mass or less, a fine metal wire pattern having conductivity can be obtained.

The contents of the components described above contained in the ink can be appropriately adjusted from the viewpoint of adjusting the amount of the voids in the fine metal wire by generating their decomposed gases or the like during sintering.

[Sintering Step]

The sintering step is the step of sintering a pattern to form a fine metal wire. This can produce a conductive part having the same fine metal wire pattern as the pattern obtained by the application of the ink. The sintering is not particularly limited as long as the method therefor can form a metal component sintered film by the fusion of the metal component. The sintering may be performed in, for example, a sintering furnace, or may be performed using plasma, a heating catalyst, ultraviolet ray, vacuum ultraviolet ray, electron beam, infrared lamp annealing, flash lamp annealing, laser, or the like. If the resulting sintered film is easily oxidized, the sintering is preferably performed in a non-oxidative atmosphere. If the metal oxide or the like is difficult to reduce with only the reducing agent that may be contained in the ink, the sintering is preferably performed in a reductive atmosphere.

The non-oxidative atmosphere is an atmosphere free from an oxidative gas such as oxygen and includes an inert atmosphere and a reductive atmosphere. The inert atmosphere is an atmosphere filled with an inert gas, for example, argon, helium, neon, or nitrogen. The reductive atmosphere refers to an atmosphere where a reductive gas such as hydrogen or carbon monoxide exists. A sintering furnace may be filled with such a gas, and the ink-coated film (dispersion-coated film) can be sintered in a closed system. Alternatively, the coated film may be sintered in the circulated system of a sintering furnace where such a gas is allowed to flow. In the case of sintering the coated film in a non-oxidative atmosphere, it is preferred that the sintering furnace should be temporarily vacuumized so that oxygen in the sintering furnace is removed and replaced with a non-oxidative gas. The sintering may be performed in a pressurized atmosphere or may be performed in a reduced pressure atmosphere.

The sintering temperature is not particularly limited and is preferably 20° C. or higher and 400° C. or lower, more preferably 50° C. or higher and 300° C. or lower, further preferably 80° C. or higher and 200° C. or lower. The sintering temperature of 400° C. or lower is preferred because a low heat-resistant substrate can be used. The sintering temperature of 20° C. or higher is preferred because the formation of a sintered film tends to proceed sufficiently, resulting in favorable conductivity. The resulting sintered film contains a conductive component derived from the metal component and may additionally contain the component used in the ink, or a non-conductive component according to the sintering temperature.

Among others, for example, heat, plasma, electron beam, or a light source is preferably used as energy at the time of sintering from the viewpoint of adjusting the diffusion and aggregation of the metal component and thereby adjusting the amount of the voids in the fine metal wire. Flash lamp annealing is preferably used. From a similar viewpoint, the sintering time is preferably 100 μsec to 50 msec, more preferably 800 μsec to 10 msec or 1 msec to 2.4 msec. The sintering may be performed using flash lamp annealing a plurality of times, if necessary.

A sintering method with plasma is more preferably used from the viewpoint mentioned above and because this method can promote the fusion of the metal component and produces a conductive film having higher conductivity. From a similar viewpoint, the output of the plasma is preferably 0.5 kW or higher, more preferably 0.6 kW or higher, further preferably 0.7 kW or higher. The upper limit value of the output of the plasma is not particularly limited and can be in a range that has no damage on the transparent substrate or the intermediate layer used. Although the lower limit value of the sintering time depends on the plasma output, the upper limit value is preferably 1000 sec or shorter, more preferably 600 sec or shorter, from the viewpoint of productivity. The sintering may be performed using plasma sintering a plurality of times, if necessary.

[Protective Layer Formation Step]

The method for producing the conductive film of the present embodiment may comprise a protective layer formation step of forming a protective layer covering the conductive part after the sintering step. A specific example of the protective layer formation step includes a method of applying a protective layer-forming component or a precursor, or a protective layer-forming composition containing the component or the precursor dissolved or dispersed in a solvent to the conductive part, followed by drying, heating, or UV irradiation, etc. to form a protective layer. The method for applying the protective layer is not particularly limited as long as the method coats the conductive part with the protective layer without exposing the conductive part to the atmosphere. For example, spin coating, die coating, bar coating, or the like can be used. Examples of the protective layer-forming component include the components listed in the section [Protective layer]. The protective layer-forming composition may contain, if necessary, a dispersant, a surfactant, a binder, or the like.

Conductive Film of Second Embodiment

The conductive film of the second embodiment is a conductive film comprising a transparent substrate and a conductive part comprising a fine metal wire pattern disposed on one side or both sides of the transparent substrate. The fine metal wire pattern is constituted by a fine metal wire. When the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ is 0.40 or more and 0.90 or less.

For example, in a conductive film comprising a fine metal wire as disclosed in Patent Literature 2, a covering layer such as a protective layer or a functional layer can be disposed on the fine metal wire surface for the purpose of improving weather resistance or conferring additional functionality. For example, a protective layer can be formed on the fine metal wire for the purpose of preventing conductivity from being reduced due to the oxidation over time of a metal atom constituting an exposed fine metal wire. However, the cross-sectional shape of a general fine metal wire is a substantially square or substantially rectangular shape. A problem of an attempt to sufficiently protect such a fine metal wire with a protective layer is that a small-thickness portion of the protective layer appears and reduces conductivity because the fine metal wire is oxidized over time from a site where the fine metal wire is not sufficiently protected with the protective layer.

Thus, the present embodiment relates to a conductive film, a conductive film roll, an electronic paper, a touch panel and a flat-panel display in which a covering layer such as a protective layer can be more uniformly formed on fine metal wire surface.

The present inventors have conducted diligent studies to solve the problem. As a result, the present inventors have found that when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, the problem can be solved by adjusting $W_{0.90}/W_0$ to within a specific range, leading to the completion of the present embodiment.

The present embodiment can provide a conductive film, a conductive film roll, an electronic paper, a touch panel and a flat-panel display in which a covering layer such as a protective layer can be more uniformly formed on fine metal wire surface.

The fine metal wire pattern is formed by transferring ink containing a metal component onto a transparent substrate. Therefore, the surface of the fine metal wire is not always a flat surface and may has a concave-convex surface. Hence, an angle formed by the surface of the fine metal wire and side wall surface is difficult to define. $W_{0.90}/W_0$ is specified to represent the roundness of this angle.

Figure 8:
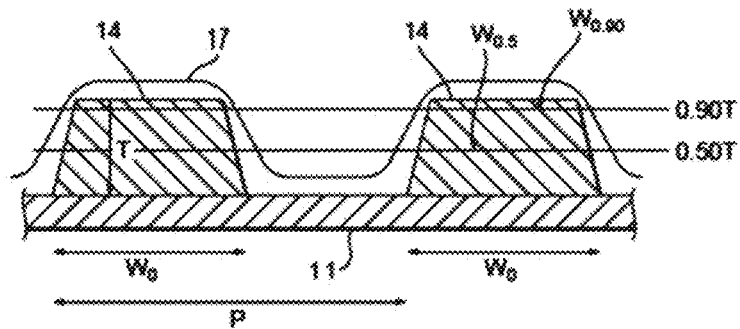
FIG. 8 shows a partial cross-sectional view taken along the III-III' line in a general conductive film having a covering layer.
Figure 9:
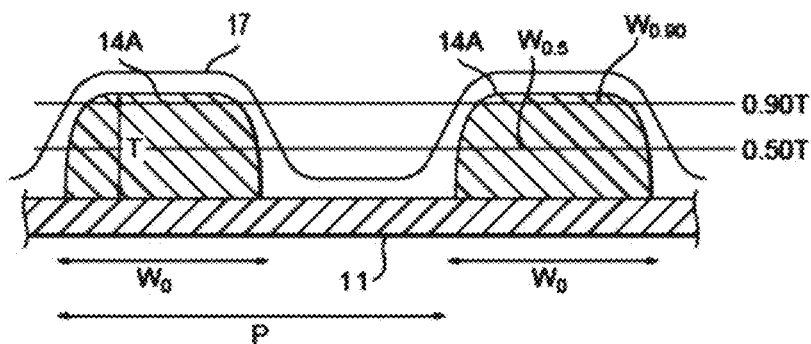
FIG. 9 shows a partial cross-sectional view taken along the III-III' line in the conductive film of FIG. 1 having a covering layer.

FIG. 8 shows a general conductive film. In a conductive film having fine metal wire 14 having $W_{0.90}/W_0$ of more than 0.90 as shown in FIG. 8, a small-thickness portion of a covering layer appears at or near a formed angle as shown in FIG. 8 when covering layer 17 is formed on the fine metal wire 14. By contrast, covering layer 17 having a sufficient thickness even at or near a formed angle is formed when covering layer 17 is formed on fine metal wire 14A having $W_{0.90}/W_0$ of 0.90 or less as shown in FIG. 9. Hence, when the covering layer 17 of FIG. 9 is a protective layer, the oxidation over time of a metal atom in the fine metal wire is suppressed without forming a small-thickness portion of the protective layer. This can suppress reduction in conductivity.

$W_{0.90}/W_0$ is 0.40 or more, whereby the conductive film can have sufficient conductivity because the cross-sectional area of the fine metal wire can be secured.

From a similar viewpoint, $W_{0.90}/W_0$ is preferably 0.55 or more and 0.85 or less.

When the width of the fine metal wire at a height of 0.50T from the fine metal wire interface on the transparent substrate side is defined as $W_{0.50}$, $W_{0.50}/W_0$ is preferably 0.70 or more and less than 1.00, more preferably 0.75 or more and 0.99 or less, further preferably 0.80 or more and 0.95 or less. $W_{0.50}/W_0$ is less than 1.00, whereby a small-thickness portion of the covering layer is less likely to appear in a region of 0.50T. When the covering layer is, for example, a protective layer, the oxidation of a metal atom in the fine metal wire can be suppressed. As a result, reduction in conductivity over time can be further suppressed. On the other hand, when $W_{0.50}/W_0$ is 0.70 or more, the conductive film can have more sufficient conductivity because the cross-sectional area of the fine metal wire can be secured.

$W_{0.90}/W_{0.50}$ is preferably 0.50 or more and 0.95 or less, more preferably 0.55 or more and 0.90 or less, further preferably 0.60 or more and 0.85 or less. $W_{0.90}/W_{0.50}$ is 0.95 or less, whereby the covering layer tends to be able to be more sufficiently thick in a region from 0.90T to 0.50T. Therefore, when the covering layer is, for example, a protective layer, the oxidation of a metal atom in the fine metal wire can be suppressed. As a result, reduction in conductivity over time can be further suppressed. $W_{0.90}/W_{0.50}$ is 0.50 or more, whereby the conductivity of the conductive film can be further improved because the cross-sectional area of the fine metal wire can be secured.

In the conductive film of the second embodiment, $W_{0.50}/W_0$ is preferably larger than $W_{0.90}/W_{0.50}$. This reduces an edge on the cross-section of the fine metal wire and tends to further improve the uniformity of the film thickness of the covering layer adhering to the fine metal wire.

It is preferred that no angle should be formed at a height position at a thickness of 0.90T from the fine metal wire interface on the transparent substrate side. The resulting covering layer tends to be able to be more sufficiently thick in a region at the height position at a thickness of 0.90T from the fine metal wire interface on the transparent substrate side.

It is preferred that the width of the fine metal wire should decrease gradually from a height position at a thickness of 0.50T toward a height position at a thickness of 0.90T from the fine metal wire interface on the transparent substrate side. The resulting covering layer tends to be able to be more sufficiently thick in a region from 0.90T to 0.50T.

Since the surface of the fine metal wire is not always a flat surface and often has a concave-convex surface, the cross-sectional shape of the fine metal wire perpendicular to the direction of drawing of the fine metal wire is not strictly defined. Examples thereof include a substantially trapezoidal shape, a substantially semicircular shape, and a substantially semi-elliptical shape. In this context, the "substantially trapezoidal shape" means that a trapezoid leg may be a straight line (side) or a curved line and means that the curved leg of the trapezoid may be an outwardly curved leg or an inwardly curved leg. In the "substantially trapezoidal shape", the upper base may be a straight line (side) or may have irregularities.

In the present specification, the width of the fine metal wire at a predetermined height from the fine metal wire interface on the cross-section of the fine metal wire perpendicular to the direction of drawing of the fine metal wire can be calculated from an electron microscope photograph of the cross-section of the fine metal wire perpendicular to the direction of drawing of the fine metal wire. Hereinafter, specific measurement methods will be described. The formation of the cross-section of the fine metal wire or SEM observation mentioned later is preferably performed in an inert atmosphere of argon or the like or in vacuum from the viewpoint of preventing the oxidation or contamination of the fine metal wire cross-section.

First, the conductive film is cut to obtain a measurement sample including the cross-section of the fine metal wire perpendicular to the direction of drawing of the fine metal wire. The method for preparing the measurement sample is not particularly limited as long as the method can suppress damage (deformation) on the fine metal wire cross-section ascribable to the formation or processing of the cross-section. Preferably, a processing method using ion beam (e.g., BIB (broad ion beam) and FIB (focused ion beam) processing methods), precision machine polishing, an ultra-microtome, or the like can be used. Particularly, a BIB processing method using argon ion beam is preferably used from the viewpoint of suppressing damage on the fine metal wire cross-section. In the present embodiment and Examples, a BIB processing method is used.

Hereinafter, the method for forming the cross-section of the fine metal wire by use of the BIB processing method will be described. First, the conductive film is cut perpendicularly to the direction of drawing of the fine metal wire to obtain a sample having an exposed cross-section to be observed. In this operation, the cross-section of the sample might have undergone slight deformation due to the cutting process. Accordingly, in the BIB processing method, this cross-section that might have undergone slight deformation is trimmed with broad ion beam to obtain a fine cross-section without deformation. Specifically, first, a shielding plate is closely attached to the surface of the transparent substrate on the side where no conductive part is formed, of the sample.

In this operation, the shielding plate is closely attached to the sample so as to expose a portion to be trimmed with broad ion beam and so as not to expose other portions. Subsequently, the sample is irradiated with broad ion beam from above the shielding plate. The exposed portion (cross-section that might have undergone deformation) is thereby trimmed with broad ion beam to obtain a measurement sample having a cross-section without deformation. The irradiation with broad ion beam from the transparent substrate side can produce a finer cross-section of the fine metal wire as compared with irradiation with broad ion beam from the conductive part side.

Alternatively, the conductive film may be cut directly with broad ion beam when cut perpendicularly to the direction of drawing of the fine metal wire. In this case, the shielding plate is closely attached to the side of the transparent substrate where no conductive part is formed in the conductive film. The sample is irradiated with broad ion beam from above the shielding plate.

The measurement sample thus obtained is observed under SEM to obtain an SEM image of the cross-section of the fine metal wire.

Maximum thickness T from the fine metal wire interface on the transparent substrate side to the fine metal wire surface is calculated from the SEM image of the fine metal wire cross-section. In this context, the "maximum thickness T" refers to the maximum thickness among thicknesses from the fine metal wire interface on the transparent substrate side to the fine metal wire surface. The width of the fine metal wire at a predetermined thickness is calculated on the basis of this maximum thickness T.

FIG. 1 shows a top view of the conductive film having a mesh pattern as the fine metal wire pattern, as one form of the conductive film of the present embodiment. Conductive film 10 of the present embodiment has conductive part 13 constituted by fine metal wire pattern 12 on transparent substrate 11.

An extraction electrode (not shown) for connection to a controller, etc. may be formed, in addition to the conductive part 13, on the transparent substrate 11 according to the application of use of the conductive film 10. The transparent substrate 11 can have the conductive part 13 on one side or both sides and may have a plurality of conductive parts 13 on one side. The conductive part 13 is constituted by fine metal wire pattern 12 configured so as to be energizable or chargeable. When the conductive film 10 of the present embodiment is integrated into an electronic device, the conductive part 13 functions as a transparent electrode for the screen portion of an electronic paper, a touch panel, or a flat-panel display, etc.

[Transparent Substrate]

The term "transparent" of the transparent substrate means that the visible light transmittance is preferably 80% or more, more preferably 90% or more, further preferably 95% or more. In this context, the visible light transmittance can be measured in accordance with JIS K 7361-1: 1997.

Examples of the material of the transparent substrate include, but are not particularly limited to: transparent inorganic substrates such as glass; and transparent organic substrates such as acrylic acid ester, methacrylic acid ester, polyethylene terephthalate, polybutylene terephthalate, polyethylene naphthalate, polycarbonate, polyarylate, polyvinyl chloride, polyethylene, polypropylene, polystyrene, nylon, aromatic polyamide, polyether ether ketone, polysulfone, polyethersulfone, polyimide, and polyetherimide. Among them, polyethylene terephthalate, polyimide, or polyethylene naphthalate is preferred. Use of polyethylene terephthalate attains better productivity (cost reduction effect) for producing the conductive film and tends to further improve the adhesion of the transparent substrate to the fine metal wire. Use of polyimide tends to further improve the heat resistance of the conductive film. Use of polyethylene naphthalate and/or polyethylene terephthalate tends to attain better adhesion of the transparent substrate to the fine metal wire.

The transparent substrate may be made of one material or may be made of two or more materials laminated with each other. When the transparent substrate is multi-layered such that two or more materials are laminated with each other, the transparent substrate may be made of organic substrates or inorganic substrates laminated with each other or may be made of an organic substrate(s) and an inorganic substrate(s) laminated with each other.

The thickness of the transparent substrate is preferably 5 μm or larger and 500 μm or smaller, more preferably 10 μm or larger and 100 μm or smaller.

[Intermediate Layer]

The conductive film of the present embodiment may have an intermediate layer between the transparent substrate and the conductive part. The intermediate layer is capable of contributing to improvement in the adhesion between the transparent substrate and the fine metal wire of the conductive part.

Examples of the component contained in the intermediate layer include, but are not particularly limited to, silicon compounds (e.g., (poly)silanes, (poly)silazanes, (poly)silthianes, (poly)siloxanes, silicon, silicon carbide, silicon oxide, silicon nitride, silicon chloride, silicate, zeolite, and silicide), aluminum compounds (e.g., aluminum oxide), and magnesium compounds (e.g., magnesium fluoride). Among them, at least one member selected from the group consisting of silicon oxide, silicon nitride, aluminum oxide, and magnesium fluoride is preferred. Use of such a component tends to further improve the transparency and durability of the conductive film and attains better productivity (cost reduction effect) for producing the conductive film. The intermediate layer can be prepared by a vapor deposition such as PVD or CVD, or a film formation method of applying and drying an intermediate layer-forming composition containing the component of the intermediate layer dispersed in a dispersion medium. The intermediate layer-forming composition may contain, if necessary, a dispersant, a surfactant, a binder, or the like.

The thickness of the intermediate layer is preferably 0.01 μm or larger and 500 μm or smaller, more preferably 0.05 μm or larger and 300 μm or smaller, further preferably 0.10 μm or larger and 200 μm or smaller. The thickness of the intermediate layer is 0.01 μm or larger, whereby the adhesion of the intermediate layer to the fine metal wire is exerted. The thickness of the intermediate layer is 500 μm or smaller, whereby the flexibility of the transparent substrate can be ensured.

The intermediate layer laminated on the transparent substrate can prevent plasma or the like from etching the transparent substrate at a site uncovered with the fine metal wire pattern part when a metal component in ink is sintered by a sintering process such as plasma.

This intermediate layer preferably further has an antistatic function in order to prevent the breaking of the fine metal wire pattern ascribable to static electricity. For the intermediate layer having an antistatic function, it is preferred that the intermediate layer should comprise at least any of a conductive inorganic oxide and a conductive organic compound. Examples of the conductive organic compound include conductive organosilane compounds, aliphatic conjugated polyacetylene, aromatic conjugated poly(p-phenylene), and heterocyclic conjugated polypyrrole. Among them, a conductive organosilane compound is preferred.

The volume resistivity of the intermediate layer is preferably 100 Ωcm or more and 100000 Ωcm or less, more preferably 1000 Ωcm or more and 10000 Ωcm or less, still more preferably 2000 Ωcm or more and 8000 Ωcm or less. The volume resistivity of the intermediate layer is 100000 Ωcm or less, whereby an antistatic function is exerted. The volume resistivity of the intermediate layer is 100 Ωcm or more, whereby the resulting conductive film can be suitably used for applications such as touch panels for which electrical conduction between fine metal wire patterns is undesirable. The volume resistivity can be adjusted by the content of the component, such as the conductive inorganic oxide or the conductive organic compound, which exerts an antistatic function, in the intermediate layer. When the intermediate layer comprises, for example, highly plasma-resistant silicon oxide (volume specific resistance: $10^{14}$ Ω·cm or more) and an organosilane compound as the conductive organic compound, the volume resistivity can be reduced by increasing the content of the conductive organosilane compound. On the other hand, the thin intermediate layer can be formed not to impair optical characteristics by increasing the content of the silicon oxide because of its high plasma resistance, although the volume resistivity is increased.

[Protective Layer]

The conductive film of the present embodiment may be provided with a protective layer covering the conductive part. The protective layer may cover only the fine metal wire constituting the conductive part or may cover the surface of the fine metal wire and the transparent substrate (or the intermediate layer).

The material of the protective layer is not particularly limited as long as the material has translucency and can exert favorable adhesion to the fine metal wire or the transparent substrate (or the intermediate layer). For example, a thermosetting resin such as phenol resin, thermosetting epoxy resin, thermosetting polyimide, melamine resin, urea resin, unsaturated polyester resin, alkyd resin, polyurethane, diallyl phthalate resin, or silicone resin, a UV curable resin such as urethane acrylate, acrylic resin acrylate, epoxy acrylate, silicone acrylate, or UV curable epoxy resin, or a commercially available coating agent can be used.

The thickness of the protective layer is preferably 0.01 μm or larger and 1.00 μm or smaller, more preferably 0.03 μm or larger and 0.80 μm or smaller, further preferably 0.05 μm or larger and 0.50 μm or smaller. The thickness of the protective layer is 0.01 μm or larger, whereby the fine metal wire protected with the protective layer can be sufficiently prevented from being oxidized. The thickness of the protective layer is 1.00 μm or smaller, whereby the transparency of the conductive film can be improved.

[Conductive Part]

The conductive part according to the second embodiment comprises a fine metal wire pattern constituted by a fine metal wire disposed on the transparent substrate. The fine metal wire pattern may be a regular pattern or an irregular pattern. The fine metal wire preferably has, for example, but not particularly limited to, a conductive component containing at least one or more metal elements selected from the group consisting of gold, silver, copper, and aluminum. Particularly, the conductive component is preferably composed mainly of silver or copper from the viewpoint of cost and conductivity and more preferably composed mainly of copper from the viewpoint of cost. In the present embodiment, the phrase "composed mainly of" means being composed of 50% by mass or more of the component.

Use of such a material tends to further improve the conductivity of the conductive film and attains excellent productivity (cost reduction effect) for producing the conductive film.

The fine metal wire comprises may comprise a non-conductive component in addition to the conductive component. Examples of the non-conductive component include, but are not particularly limited to, metal oxides, metal compounds, and organic compounds. Examples of non-conductive components include metal oxides, metal compounds, and organic compounds that are components derived from components contained in ink mentioned later and remain in the fine metal wire after sintering among the components contained in ink. The content ratio of the conductive component is preferably 50% by mass or more, more preferably 60% by mass or more, further preferably 70% by mass or more. The upper limit of the content ratio of the conductive component is not particularly limited and is 100% by mass. The content ratio of the non-conductive component is preferably 50% by mass or less, more preferably 40% by mass or less, further preferably 30% by mass or less. The lower limit of the content ratio of the non-conductive component is not particularly limited and is 0% by mass.

(Fine Metal Wire Pattern)

The fine metal wire pattern can be designed according to the application of an intended electronic device. Examples thereof include, but are not particularly limited to, a mesh pattern (FIGS. 1 and 2) formed by a plurality of lines of the fine metal wire intersecting in a net-like form, and a line pattern (FIGS. 3 and 4) formed by a plurality of substantially parallel lines of the fine metal wire. Alternatively, the fine metal wire pattern may be a combination of the mesh pattern and the line pattern. The mesh of the mesh pattern may have a square or rectangular shape as shown in FIG. 1 or may have a polygonal shape such as a rhombus as shown in FIG. 2. The fine metal wire constituting the line pattern may be a straight line as shown in FIG. 3 or may be a curved line as shown in FIG. 4. The fine metal wire constituting the mesh pattern can also be a curved line.

Referring to FIG. 9, the width $W_0$ of the fine metal wire on the fine metal wire interface on the transparent substrate side in the second embodiment is the width (line width $W_0$) on the side contacted with the transparent substrate 11, of fine metal wire 14A having a substantially trapezoidal cross-section. The line width $W_0$, the maximum thickness T, 0.50T, and 0.90T of the fine metal wire pattern are each defined as shown in FIG. 9. Pitch P means the sum of the line width $W_0$ and the distance between lines of the fine metal wire.

The width $W_0$ of the fine metal wire on the fine metal wire interface on the transparent substrate side in the second embodiment is, for example, 0.1 µm or larger and 5.0 µm or smaller, preferably 0.2 µm or larger and 4.0 µm or smaller, more preferably 0.3 µm or larger and 3.0 µm or smaller, further preferably 0.4 µm or larger and 2.5 µm or smaller. When the line width of the fine metal wire is 0.1 µm or larger, the conductivity of the fine metal wire can be sufficiently secured. A thinner line width of the fine metal wire permits increase in the number of lines of the fine metal wire at the same aperture ratio. This attains more uniform electrical field distribution of the conductive film so that this enables a higher-resolution electronic device to be fabricated. If some lines of the fine metal wire are broken, this influence can be compensated for by the other lines of the fine metal wire. On the other hand, when the line width of the fine metal wire is 5.0 µm or smaller, the visibility of the fine metal wire is further reduced. Thus, the transparency of the conductive film tends to be further improved.

The maximum thickness T of the fine metal wire is preferably 10 nm or larger and 1,000 nm or smaller. The lower limit of the maximum thickness T is more preferably 50 nm or larger, further preferably 75 nm or larger. The maximum thickness T of the fine metal wire is 10 nm or larger, whereby conductivity tends to be further improved. On the other hand, the thickness T of the fine metal wire is 1,000 nm or smaller, whereby high transparency can be exerted in a wide view angle.

(Aspect Ratio)

The aspect ratio represented by the maximum thickness T of the fine metal wire to the width $W_0$ of the fine metal wire is preferably 0.05 or more and 1.00 or less. The lower limit of the aspect ratio is more preferably 0.08 or more, further preferably 0.10 or more. The aspect ratio is 0.05 or more, whereby conductivity tends to be able to be further improved without reducing transmittances.

(Pitch)

The pitch P of the fine metal wire pattern is preferably 5 µm or larger, more preferably 50 µm or larger, further preferably 100 µm or larger. The pitch P of the fine metal wire pattern is 5 µm or larger, whereby a favorable transmittance can be obtained. The pitch P of the fine metal wire pattern is preferably 1,000 µm or smaller, more preferably 500 µm or smaller, further preferably 250 µm or smaller. The pitch P of the fine metal wire pattern is 1,000 µm or smaller, whereby conductivity tends to be able to be further improved. When the shape of the fine metal wire pattern is a mesh pattern, an aperture ratio of 99% can be attained by setting the pitch to 200 µm of a fine metal wire pattern having a line width of 1 µm.

The line width, aspect ratio, and pitch of the fine metal wire pattern can be confirmed by observing the conductive film cross-section under an electron microscope or the like. The line width and pitch of the fine metal wire pattern can also be observed under a laser microscope or an optical microscope. Since the pitch and the aperture ratio have a relational expression mentioned later, one of these factors can be calculated if the other factor is known. Examples of the method for adjusting the line width, aspect ratio, and pitch of the fine metal wire pattern to the desired ranges include a method of adjusting grooves of a printing plate for use in a method for producing the conductive film mentioned later, and a method of adjusting the average particle size of metal particles in ink.

(Aperture Ratio)

The aperture ratio of the fine metal wire pattern is preferably 60% or more, more preferably 70% or more, further preferably 80% or more, particularly preferably 90% or more. The aperture ratio of the fine metal wire pattern is equal to or more than the specific value mentioned above, whereby the permeability of the conductive film tends to be further improved. The aperture ratio of the fine metal wire pattern is preferably less than 100%, more preferably 95% or less, further preferably 90% or less, still further preferably 80% or less, even further preferably 70% or less, particularly preferably 60% or less. The aperture ratio of the fine metal wire pattern is equal to or less than the specific value mentioned above, whereby the conductivity of the conductive film tends to be further improved. The aperture ratio of the fine metal wire pattern also differs in appropriate value depending on the shape of the fine metal wire pattern. The upper limit value and lower limit value of the aperture ratio of the fine metal wire pattern can be appropriately combined according to the required performance (transmittance and sheet resistance) of an intended electronic device.

The "aperture ratio of the fine metal wire pattern" can be calculated according to an expression given below as to a region where the fine metal wire pattern is formed on the transparent substrate. The region where the fine metal wire pattern is formed on the transparent substrate is a range represented by S in FIG. 1 and excludes a marginal part and the like where the fine metal wire pattern is not formed.

Aperture ratio of the fine metal wire pattern=(1−
Area occupied by the fine metal wire pattern/
Area of the transparent substrate)×100

The relational expression of the aperture ratio and the pitch differs depending on the shape of the fine metal wire pattern. Their relationship can be calculated as given below. FIG. 6 shows a schematic view of a mesh pattern (grid pattern) having pattern unit 16. In the case of this mesh pattern, the aperture ratio and the pitch have the following relational expression:

Aperture ratio={Area of opening part 15/Area of pattern unit 16}×100={((Pitch $P1$−Line width $W1$)×(Pitch $P2$−Line width $W2$))/(Pitch $P1$×Pitch $P2$)}×100

FIG. 7 shows a schematic view of a line pattern. In the case of this line pattern, the aperture ratio and the pitch have the following relational expression:

Aperture ratio={(Pitch $P$−Line width $W$)/Pitch $P$}×100

(Sheet Resistance)

The sheet resistance of the conductive film is preferably 0.1 Ω/sq or more and 1,000 Ω/sq or less, more preferably 0.1 Ω/sq or more and 500 Ω/sq or less, further preferably 0.1 Ω/sq or more and 300 Ω/sq or less, still further preferably 0.1 Ω/sq or more and 200 Ω/sq or less, even further preferably 0.1 Ω/sq or more and 100 Ω/sq or less, even further preferably 0.1 Ω/sq or more and 20 Ω/sq or less, even further preferably 0.1 Ω/sq or more and 10 Ω/sq or less. The sheet resistance of the conductive film can be measured by a method given below.

First, a rectangular portion throughout which the fine metal wire pattern is disposed is cut out of the conductive film to obtain a measurement sample. Current collector parts for sheet resistance measurement electrically connected to the fine metal wire pattern are formed at both ends of the resulting measurement sample. Electrical resistance R (Ω) between the current collector parts disposed at both ends is measured. Sheet resistance $R_s$ (Ω/sq) can be calculated according to the following expression from the obtained electrical resistance R (Ω), distance L (mm) between the current collector parts of the measurement sample, and length D (mm) in the depth direction.

$R_s = R/L \times D$

A lower sheet resistance tends to suppress power loss. Hence, an electronic paper, a touch panel, and a flat-panel display having less power consumption can be obtained.

The sheet resistance of the conductive film tends to be reduced by improving the aspect ratio (height) of the fine metal wire. The sheet resistance may be adjusted by selecting the type of the metal material constituting the fine metal wire.

(Visible Light Transmittance)

The visible light transmittance of the conductive film is preferably 80% or more and 100% or less, more preferably 90% or more and 100% or less. In this context, the visible light transmittance can be measured in accordance with JIS K 7361-1: 1997 for total light transmittance by calculating the transmittance in a range of the visible light (360 to 830 nm).

The visible light transmittance of the conductive film tends to be improved by decreasing the line width of the fine metal wire pattern or by increasing the aperture ratio thereof.

(Haze)

The haze of the conductive film is preferably 0.01% or more and 5.00% or less. The upper limit of the haze is more preferably 3.00% or less, further preferably 1.00% or less. When the upper limit of the haze is 5.00% or less, the cloudiness of the conductive film to visible light can be sufficiently reduced. The haze described herein can be measured in accordance with JIS K 7136: 2000 for haze.

Second Embodiment: Method for Producing Conductive Film

Examples of the method for producing the conductive film of the second embodiment include, but are not particularly limited to, a method having a pattern formation step of forming a pattern on a transparent substrate using ink containing a metal component, and a sintering step of sintering the pattern to form a fine metal wire. In this case, the method for producing the conductive film of the second embodiment may comprise an intermediate layer formation step of forming an intermediate layer on the surface of the transparent substrate, prior to the pattern formation step.

[Intermediate Layer Formation Step]

A specific example of the intermediate layer formation step includes a method of forming an intermediate layer by the film formation of an intermediate layer-forming component on the surface of the transparent substrate by use of a vapor deposition such as PVD or CVD. Another specific example of the intermediate layer formation step includes a method of forming an intermediate layer by applying an intermediate layer-forming composition containing an intermediate layer-forming component dispersed in a dispersion medium onto the surface of the transparent substrate, followed by drying. Examples of the intermediate layer-forming component include the components listed in the section [Intermediate layer]. The intermediate layer-forming composition may contain, if necessary, a dispersant, a surfactant, a binder, or the like.

[Pattern Formation Step]

The pattern formation step is the step of forming a pattern using ink containing a metal component. The pattern formation step is not particularly limited as long as the step is performed by a plate printing method using a printing plate having grooves of the desired fine metal wire pattern. Such a method has, for example, the steps of: coating transfer medium surface with ink; allowing the transfer medium surface coated with ink to face the protruding portion surface of a relief printing plate, and pressing and contacting these surfaces to transfer the ink on the transfer medium surface onto the protruding portion surface of the relief printing plate; and allowing the transfer medium surface coated with ink to face the surface of the transparent substrate, and pressing and contacting these surfaces to transfer the ink remaining on the transfer medium surface to the surface of the transparent substrate. When the intermediate layer is formed on the transparent substrate, the ink is transferred to the intermediate layer surface.

(Ink)

The ink for use in the pattern formation step contains a metal component and a solvent and may contain, if necessary, a surfactant, a dispersant, a reducing agent, or the like. The metal component may be contained as metal particles in the ink or may be contained as a metal complex in the ink. In this context, examples of the metal element species contained in the metal component include, but are not particularly limited to, gold, silver, copper, and aluminum. Among them, silver or copper is preferred, and copper is more preferred.

The average primary particle size of the metal particles is preferably 100 nm or smaller, more preferably 50 nm or smaller, further preferably 30 nm or smaller. The lower limit of the average primary particle size of the metal particles is not particularly limited and is, for example, 1 nm or larger. The average primary particle size of the metal particles is 100 nm or smaller, whereby the width $W_0$ of the resulting fine metal wire can be further thinned. In the present embodiment, the "average primary particle size" refers to the particle size of each individual metal particle (so-called primary particle) and is distinguished from an average secondary particle size which is the particle size of an aggregate (so-called secondary particle) formed by a plurality of metal particles together.

The metal particles may be in the form of a metal oxide such as copper oxide, a metal compound, or core/shell particles having copper in the core part and copper oxide in the shell part. The form of the metal particles can be appropriately determined from the viewpoint of dispersibility and sinterability.

The content of the metal particles in the ink is preferably 1% by mass or more and 40% by mass or less, more preferably 5% by mass or more and 35% by mass or less, further preferably 10% by mass or more and 35% by mass or less, based on the total mass of the ink composition. When the content of the metal particles in the ink is 1% by mass or more based on the total mass of the ink composition, a fine metal wire pattern having conductivity can be obtained. When the content is 40% by mass or less, the ink can be printed in the fine metal wire pattern.

Examples of the surfactant include, but are not particularly limited to, silicone surfactants and fluorine surfactants. Use of such a surfactant improves the coatability of a transfer medium (blanket) with the ink and the smoothness of the ink used in coating and tends to produce a more uniform coating film. The surfactant is preferably configured so as to permit dispersion of the metal component and to be less likely to remain in sintering.

The content of the surfactant in the ink is preferably 0.01% by mass or more and 10% by mass or less, more preferably 0.1% by mass or more and 20% by mass or less, further preferably 2% by mass or more and 10% by mass or less, based on the total mass of the ink composition. When the content of the surfactant in the ink is 0.01% by mass or more based on the total mass of the ink composition, coatability with the ink and the smoothness of the ink used in coating can be improved. When the content is 10% by mass or less, a low resistant fine metal wire pattern can be obtained.

Examples of the dispersant include, but are not particularly limited to, a dispersant that noncovalently binds to or interacts with the metal component, and a dispersant that covalently binds to the metal component. Examples of the functional group for noncovalent binding or interaction include dispersants having a phosphoric acid group. Use of such a dispersant tends to further improve the dispersibility of the metal component.

The content of the dispersant in the ink is preferably 0.1% by mass or more and 30% by mass or less, more preferably 1% by mass or more and 20% by mass or less, further preferably 2% by mass or more and 10% by mass or less, based on the total mass of the ink composition. When the content of the dispersant in the ink is 0.1% by mass or more based on the total mass of the ink composition, ink containing the metal particles dispersed therein can be obtained. When the content is 30% by mass or less, a low resistant fine metal wire pattern can be obtained.

Examples of the solvent include: alcohol solvents such as monoalcohols and polyalcohols; alkyl ether solvents; hydrocarbon solvents; ketone solvents; and ester solvents. These solvents may be used singly, or one or more thereof may be used in combination. For example, a monoalcohol having 10 or less carbon atoms and a polyalcohol having 10 or less carbon atoms are used in combination. Use of such a solvent tends to further improve the coatability of a transfer medium (blanket) with the ink, the transferability of the ink from a transfer medium to a relief printing plate, the transferability of the ink from the transfer medium to the transparent substrate, and the dispersibility of the metal component. The solvent is preferably configured so as to permit dispersion of the metal component and to be less likely to remain in sintering.

The content of the solvent in the ink is a balance of the components such as the metal particles, the surfactant, and the dispersant mentioned above and is, for example, preferably 50% by mass or more and 99% by mass or less, more preferably 60% by mass or more and 90% by mass or less, further preferably 70% by mass or more and 80% by mass or less, based on the total mass of the ink composition. When the content of the solvent in the ink is 50% by mass or more based on the total mass of the ink composition, the ink can be printed in the fine metal wire pattern. When the content is 99% by mass or less, a fine metal wire pattern having conductivity can be obtained.

Examples of the method for setting $W_{0.90}/W_0$, $W_{0.50}/W_0$, and $W_{0.90}/W_{0.50}$ in the fine metal wire pattern to within their respective desired ranges include the adjustment of ink viscosity using a viscosity adjuster or the like so as to attain a shape within the desired range, and a method of controlling a process time for transferring ink on transfer medium surface to a relief printing plate in a pattern formation step

[Sintering Step]

In the sintering step, for example, the metal component in the ink transferred to the surface of the transparent substrate or the intermediate layer is sintered. The sintering is not particularly limited as long as the method therefor can form a metal component sintered film by the fusion of the metal component. The sintering may be performed in, for example, a sintering furnace, or may be performed using plasma, a heating catalyst, ultraviolet ray, vacuum ultraviolet ray, electron beam, infrared lamp annealing, flash lamp annealing, laser, or the like. If the resulting sintered film is easily oxidized, the sintering is preferably performed in a non-oxidative atmosphere. If the metal oxide or the like is difficult to reduce with only the reducing agent that may be contained in the ink, the sintering is preferably performed in a reductive atmosphere.

The non-oxidative atmosphere is an atmosphere free from an oxidative gas such as oxygen and includes an inert atmosphere and a reductive atmosphere. The inert atmosphere is an atmosphere filled with an inert gas, for example, argon, helium, neon, or nitrogen. The reductive atmosphere refers to an atmosphere where a reductive gas such as hydrogen or carbon monoxide exists. A sintering furnace may be filled with such a gas, and the ink-coated film (dispersion-coated film) can be sintered in a closed system. Alternatively, the dispersion-coated film may be sintered in the circulated system of a sintering furnace where such a gas is allowed to flow. In the case of sintering the dispersion-coated film in a non-oxidative atmosphere, it is preferred that the sintering furnace should be temporarily vacuumized so that oxygen in the sintering furnace is removed and replaced with a non-oxidative gas. The sintering may be performed in a pressurized atmosphere or may be performed in a reduced pressure atmosphere.

The sintering temperature is not particularly limited and is preferably 20° C. or higher and 400° C. or lower, more preferably 50° C. or higher and 300° C. or lower, further preferably 80° C. or higher and 200° C. or lower. The sintering temperature of 400° C. or lower is preferred because a low heat-resistant substrate can be used. The sintering temperature of 20° C. or higher is preferred because the formation of a sintered film tends to proceed sufficiently, resulting in favorable conductivity. The resulting sintered film contains a conductive component derived from the metal component and may additionally contain the component used in the ink, or a non-conductive component according to the sintering temperature.

Among others, for example, heat, plasma, electron beam, or a light source is preferably used as energy at the time of sintering from the viewpoint of adjusting the diffusion and aggregation of the metal component and thereby adjusting the amount of the voids in the fine metal wire. Flash lamp annealing is preferably used. From a similar viewpoint, the sintering time is preferably 100 μsec to 50 msec, more preferably 800 μsec to 10 msec or 1 msec to 2.4 msec. The sintering may be performed using flash lamp annealing a plurality of times, if necessary.

A sintering method with plasma is more preferably used from the viewpoint mentioned above and because this method can promote the fusion of the metal component and produces a conductive film having higher conductivity. From a similar viewpoint, the output of the plasma is preferably 0.5 kW or higher, more preferably 0.6 kW or higher, further preferably 0.7 kW or higher. The upper limit value of the output of the plasma is not particularly limited and can be in a range that has no damage on the transparent substrate or the intermediate layer used. Although the lower limit value of the sintering time depends on the plasma output, the upper limit value is preferably 1000 sec or shorter, more preferably 600 sec or shorter, from the viewpoint of productivity. The sintering may be performed using plasma sintering a plurality of times, if necessary.

[Protective Layer Formation Step]

The method for producing the conductive film of the present embodiment may comprise a protective layer formation step of forming a protective layer covering the conductive part after the sintering step. A specific example of the protective layer formation step includes a method of applying a protective layer-forming component or a precursor, or a protective layer-forming composition containing the component or the precursor dissolved or dispersed in a solvent to the conductive part, followed by drying, heating, or UV irradiation, etc. to form a protective layer. The method for applying the protective layer is not particularly limited as long as the method coats the conductive part with the protective layer without exposing the conductive part to the atmosphere. For example, spin coating, die coating, bar coating, or the like can be used. Examples of the protective layer-forming component include the components listed in the section [Protective layer]. The protective layer-forming composition may contain, if necessary, a dispersant, a surfactant, a binder, or the like.

[Conductive Film Roll]

The conductive film roll of the present embodiment comprises the conductive film wound into a roll. The conductive film roll may have a winding core around which the conductive film is wound, at the central part. The conductive film roll of the present embodiment is cut, for use, into an appropriate size according to the desired application (e.g., electronic papers, touch panels, and flat-panel displays).

[Electronic Paper]

Figure 10:
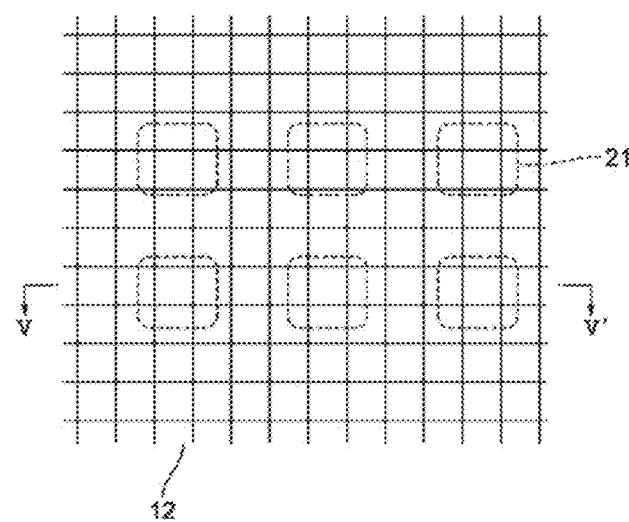
FIG. 10 shows a top view showing one form of an electronic paper comprising the conductive film of the present embodiment.
Figure 11:
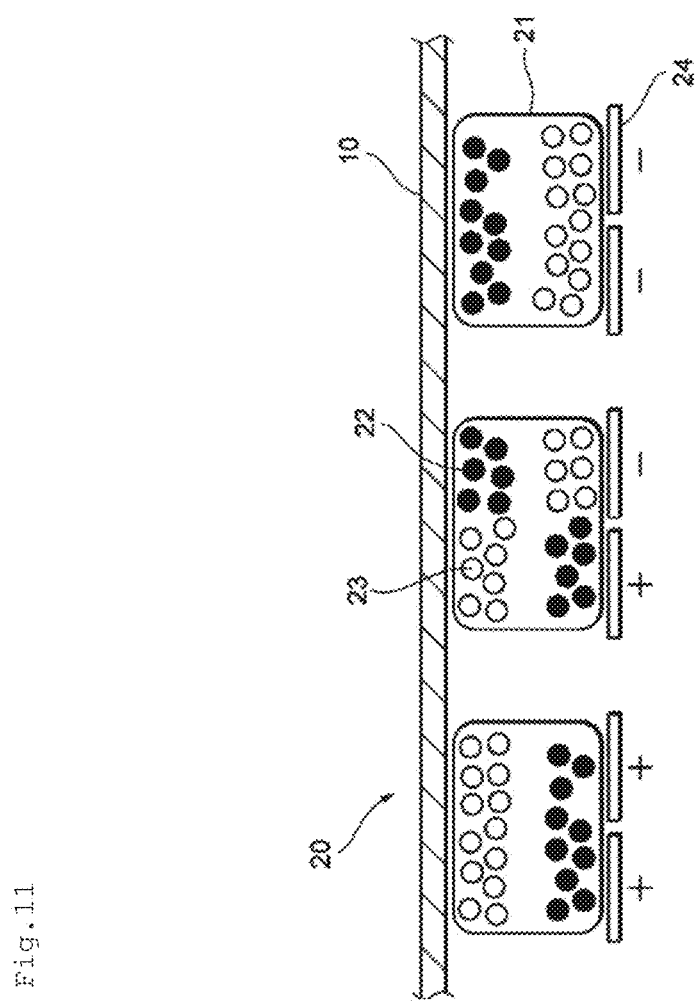
FIG. 11 shows a partial cross-sectional view taken along the V-V' line in the electronic paper of the present embodiment.
Figure 12:
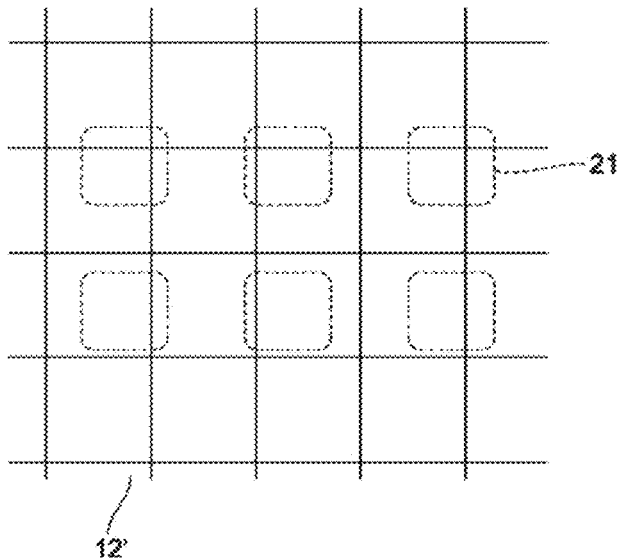
FIG. 12 shows a top view showing one form of an electronic paper comprising a conventional conductive film.

The electronic paper of the present embodiment is not particularly limited as long as the electronic paper comprises the conductive film of the present embodiment. FIG. 10 shows a top view showing one form of the electronic paper comprising the conductive film of the present embodiment (mesh pattern). FIG. 11 shows a partial cross-sectional view taken along the V-V' line in the electronic paper of the present embodiment. FIG. 12 shows a top view showing one form of an electronic paper comprising a conventional conductive film having the same aperture ratio as in FIG. 10 and a thicker line width of a fine metal wire.

As shown in FIG. 10, electronic paper 20 is configured such that fine metal wire pattern 12 is disposed on cups 21 and an electrical field can be applied to the cups 21. Specifically, as shown in FIG. 11, charged black pigment 22 and charged white pigment 23 are housed in the cups 21 of the electronic paper 20. The behaviors of the charged black pigment 22 and the charged white pigment 23 are controlled by the electrical field between bottom electrode 24 and conductive film 10.

As shown by the comparison between FIG. 10 and FIG. 12, a finer pattern of the fine metal wire having the same aperture ratio increases the number of transverse lines of fine metal wire 14 directly above the cups 21 and enables an electrical field to be more uniformly applied to the cups 21. Thus, the electronic paper 20 comprising the conductive film 10 of the present embodiment is capable of offering a higher-resolution image. The electronic paper 20 of the present embodiment is not limited to those described above.

[Touch Panel]

Figure 13:
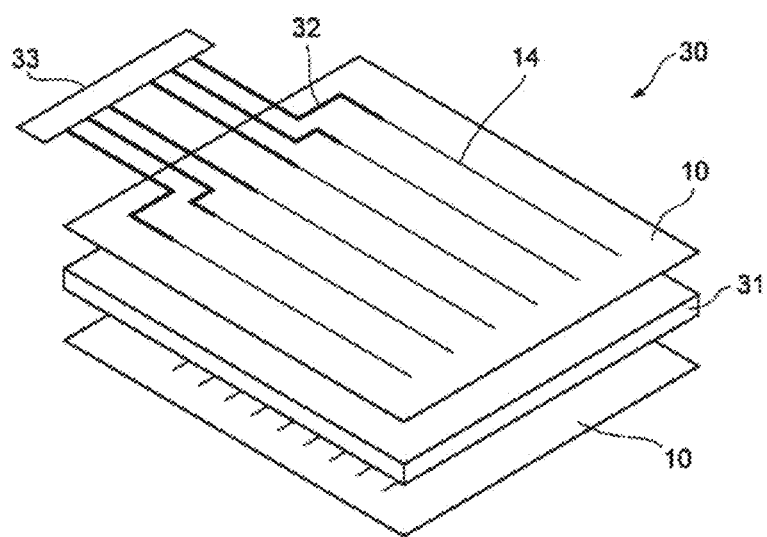
FIG. 13 shows a perspective view showing one form of a touch panel comprising the conductive film of the present embodiment.

The touch panel of the present embodiment is not particularly limited as long as the touch panel comprises the conductive film of the present embodiment. FIG. 13 shows a perspective view showing one form of the touch panel comprising the conductive film of the present embodiment (line pattern). In capacitive-type touch panel 30, two conductive films 10 are located on the front and back sides of insulator 31. These two conductive films 10 are opposed to each other such that their line patterns intersect each other. The conductive film 10 may have extraction electrode 32. The extraction electrode 32 is connected to the fine metal wire 14 and controller 33 (CPU, etc.) for switching the energization of the fine metal wire 14.

Figure 14:
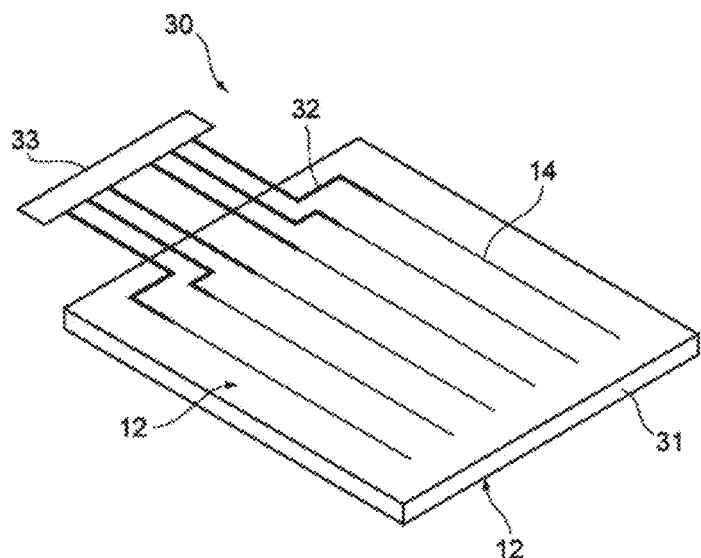
FIG. 14 shows a perspective view showing another form of a touch panel comprising the conductive film of the present embodiment.

FIG. 14 shows a perspective view showing another form of the touch panel comprising the conductive film of the present embodiment (line pattern). This touch panel 30 comprises fine metal wire patterns 12 on both sides of the conductive film 10 of the present embodiment, instead of comprising two conductive films 10 on the front and back sides of insulator 31. Thus, this touch panel 30 comprises the two fine metal wire patterns 12 on the front and back sides of the insulator 31 (transparent substrate 11).

The touch panel of the present embodiment is not limited by the capacitive type and may be of resistive type, projected capacitive type, surface capacitive type, or the like.

[Flat-Panel Display]

The flat-panel display of the present embodiment is not particularly limited as long as the flat-panel display comprises the conductive film of the present embodiment.

EXAMPLES

Hereinafter, the embodiments of the present invention will be specifically described with reference to Examples and Comparative Examples. However, the present invention is not limited by these Examples and Comparative Examples by any means.

<<Transparent Substrate>>

[Preparation of Transparent Substrate A1]

Polyethylene terephthalate (PET) was used as a transparent substrate. A composition for intermediate layer formation containing silicon oxide nanoparticles and a conductive organosilane compound was applied onto PET and dried so that a film having an antistatic function, having a thickness of 150 nm and a volume resistivity of 5000 Ωcm, and containing silicon oxide was formed as an intermediate layer to obtain transparent substrate A1.

[Preparation of Transparent Substrate A2]

Transparent substrate A2 was obtained in the same way as the method for preparing the transparent substrate A1 except that polyethylene naphthalate (PEN) was used instead of PET as a transparent substrate.

<<Ink>>

[Ink A1]

20 parts by mass of copper oxide nanoparticles (fine cupric oxide particles manufactured by CIK NanoTek Corp.), 4 parts by mass of a dispersant (manufactured by BYK-Chemie GmbH, product name: Disperbyk-145), 1 part by mass of a surfactant (manufactured by AGC Seimi Chemical Co., Ltd., product name: S-611), and 75 parts by mass of an organic solvent (n-butanol and 2-propylene glycol) were mixed to prepare ink A1 containing the copper oxide nanoparticles dispersed therein.

[Ink A2]

50 parts by mass of ethanol were added to 100 parts by mass of silver nanoink (RAGT-29) manufactured by DIC Corp. to prepare ink A2.

Example A1

<<Preparation of Conductive Film>>

First, ink was applied to transfer medium surface. Subsequently, the transfer medium surface coated with ink was allowed to face a printing plate having grooves of a fine metal wire pattern, pressed and contacted to transfer a portion of the ink on the transfer medium surface to the protruding portion surface of the printing plate. Then, the transfer medium surface coated with the ink except for the transferred ink was allowed to face a transparent substrate, pressed and contacted to transfer the ink having the desired fine metal wire pattern onto the transparent substrate. Subsequently, the ink pattern was sintered by flash lamp annealing under conditions given below using Pulseforge 1300 manufactured by NovaCentrix to obtain a conductive film having a fine metal wire in a mesh pattern having a line width of 1 μm. The fine metal wire of the obtained conductive film was unable to be visually confirmed because of the low visibility of the fine metal wire. Various characteristics of the obtained conductive film are shown in Table 1.

Light source: xenon flash lamp
Irradiation wavelength: 200 to 1,500 nm
Irradiation energy: 30 J/cm$^2$
Irradiation time: 1,500 μsec
Environment: room temperature environment <<Evaluation of Conductive Film>>

[Sheet Resistance]

Sheet resistance $R_{s0}$ (Ω/sq) of the obtained conductive film was measured by the following method: a measurement sample of 100 mm square was cut out of a portion throughout which the fine metal wire pattern was disposed in the conductive film. Subsequently, silver paste was applied to both ends in the width direction of the surface of the obtained measurement sample using a screen printing apparatus, and dried to form current collector parts which is 10 mm width×100 mm depth as shown in FIG. 15. Subsequently, electrical resistance R (Ω) between the current collector parts at both ends of the sample was measured by the two-terminal method involving the contact of ohmmeter measuring terminals. The sheet resistance $R_{s0}$ (Ω/sq) was calculated according to an expression given below from the obtained electrical resistance. The results are shown in Table 1 below. The sheet resistance of a conductive film having a protective layer on the surface was measured by preparing a conductive film in which the current collector parts were exposed from the fine metal wire pattern and the other part of the fine metal wire pattern was covered with the protective layer. Specifically, the current collector parts formed by the method mentioned above were masked. A protective layer was formed. Finally, the masking was removed to prepare a conductive film in which only the current collector parts were exposed.

$R_{s0}=R/L \times D$

L: 80 (mm): distance between the current collector parts
D: 100 (mm): depth of the measurement sample

[Visible Light Transmittance and Haze]

The visible light transmittance of the conductive film was measured by calculating a transmittance to visible light having a wavelength of 360 to 830 nm in accordance with JIS K 7361-1: 1997 for total light transmittance. The haze of the conductive film was also measured in accordance with JIS K 7136: 2000. The results are shown in Table 1 below.

[SEM Observation of Fine Metal Wire Cross-Section]

A small piece of several mm square was cut out of the obtained conductive film and BIB-processed with argon ion beam by the method mentioned above under conditions involving an acceleration voltage of 4 kV using SM-09010CP manufactured by JEOL Ltd. to prepare a measurement sample including the cross-section of the fine metal wire perpendicular to the direction of drawing of the fine metal wire. Subsequently, the cross-sectional surface of the fine metal wire was treated by Os plasma coating for conferring conductivity.

Subsequently, a SEM image of the cross-section of the fine metal wire was obtained under conditions given below using a scanning electron microscope (SU8220) manufactured by Hitachi High-Technologies Corp.

Acceleration voltage: 1 kV
Emission current: 10 μA
Measurement magnification: ×50,000
Detector: upper detector
Working distance: approximately 3 mm Thickness T of the fine metal wire was measured from the obtained SEM image of the cross-section of the fine metal wire.

Figure 16:
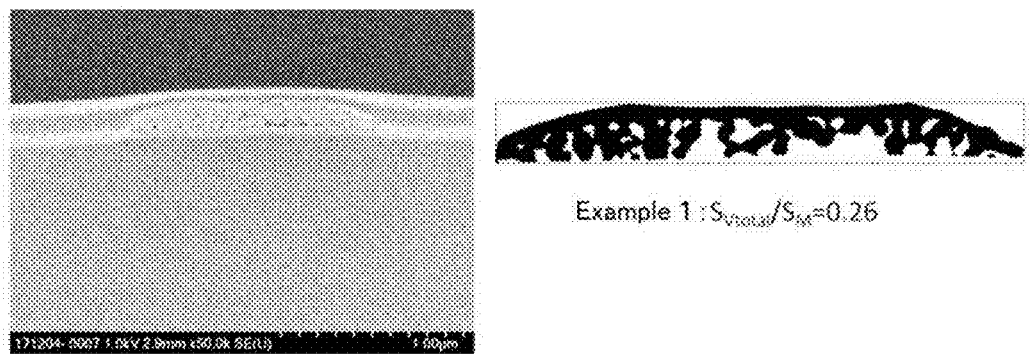
FIG. 16 shows an electron microscope photograph of Example A1.

The SEM image of the cross-section of the fine metal wire was analyzed using ImageJ. Specifically, only the cross-section of the fine metal wire was extracted from the SEM image (8 bit), and fine noise contained in the image was removed by median filter treatment. Subsequently, the extracted cross-section of the fine metal wire was binarized. $S_M$, $S_{Vtotal}$, $S_{V0.2}$, and $S_{V0.8}$ were each calculated, and $S_{Vtotal}/S_M$, $S_{V0.2}/S_{Vtotal}$, and $S_{V0.8}/S_{Vtotal}$ were calculated. The results are shown in Table 1 below. FIG. 16 shows an electron microscope photograph of the cross-section of the fine metal wire perpendicular to the direction of drawing of the fine metal wire of Example A1.

[Flexibility]

In order to evaluate the flexibility of the obtained conductive film, a repeated bending test was conducted, and the rate of change in sheet resistance (%) between before and after the test was measured. In the case of poor flexibility, the rate of change in sheet resistance was large due to the breaking of the fine metal wire, etc. In the case of excellent flexibility, the rate of change in sheet resistance was small.

First, sheet resistance $R_{s0}$ (Ω/sq) of the conductive film was measured before the repeated bending test by the same method as above. Subsequently, the conductive film was subjected to the repeated bending test under conditions given below in accordance with JIS C 5016: 1994 using a film bending tester (IMC-1304) manufactured by Imoto Machinery Co., Ltd. as a bending tester.

Bend radius: 5 mm
Test stroke: 20 mm
Bending rate: 90 rpm
The number of times of bending: 10,000

Finally, sheet resistance $R_{s1}$ (Ω/sq) of the conductive film was measured after the repeated bending test. The rate of change in sheet resistance was calculated according to the following expression.

(Rate of change in sheet resistance)=$R_{s1}/R_{s0} \times 100$

The results are shown in Table 1 below.

Examples A2 to A12 and Comparative Examples A1 to A4, and Reference Examples A1 and A2

A conductive film was prepared and evaluated by the same operation as in Example A1 except that the transparent substrate, the ink, the line width, and the sintering conditions, etc. were each changed as shown in Table 1. The results are shown in Table 1 below. The fine metal wires of the obtained conductive films except for the ones of Reference Examples were unable to be visually confirmed because of the low visibility of the fine metal wires.

TABLE 1

| | | | Sintering conditions | | Conductive film | | | | | | Evaluation | | | |
|---|---|---|---|---|---|---|---|---|---|---|---|---|---|---|
| | Transparent substrate Name | Ink Name | Irradiation energy (J/cm²) | Irradiation time (μsec) | Line Width W (μm) | Thickness (μm) | $S_{Vtotal}/S_M$ | $S_{V0.2}/S_{Vtotal}$ | $S_{V0.8}/S_{Vtotal}$ | $(S_{V0.2}+S_{V0.8})/S_{Vtotal}$ | Sheet resistance (Ω/sp) | Visible light transmittance (%) | Haze (%) | Rate of change in sheet resistance (%) |
| Example A1 | Transparent substrate A1 | Ink A1 | 30 | 1,500 | 1.0 | 0.152 | 0.26 | 0.31 | 1.00 | 1.31 | 110 | 92 | 1.93 | 112 |
| Example A2 | Transparent substrate A1 | Ink A1 | 25 | 2,000 | 1.0 | 0.093 | 0.11 | 0.45 | 1.00 | 1.45 | 108 | 92 | 1.52 | 119 |
| Example A3 | Transparent substrate A1 | Ink A1 | 38 | 1,200 | 1.0 | 0.175 | 0.36 | 0.22 | 0.99 | 1.21 | 115 | 92 | 2.01 | 116 |
| Example A4 | Transparent substrate A1 | Ink A1 | 40 | 1,200 | 1.0 | 0.202 | 0.39 | 0.19 | 0.98 | 1.17 | 121 | 92 | 2.25 | 115 |
| Example A5 | Transparent substrate A1 | Ink A1 | 42 | 1,000 | 1.0 | 0.264 | 0.40 | 0.18 | 0.83 | 1.01 | 132 | 92 | 2.53 | 118 |
| Example A6 | Transparent substrate A1 | Ink A1 | 30 | 1,000 | 0.5 | 0.087 | 0.33 | 0.32 | 0.95 | 1.27 | 117 | 93 | 2.24 | 116 |
| Example A7 | Transparent substrate A1 | Ink A1 | 30 | 1,800 | 2.0 | 0.345 | 0.20 | 0.37 | 1.00 | 1.37 | 107 | 92 | 1.65 | 110 |
| Example A8 | Transparent substrate A1 | Ink A1 | 30 | 2,100 | 5.0 | 0.992 | 0.17 | 0.44 | 1.00 | 1.44 | 104 | 91 | 1.22 | 107 |
| Example A9 | Transparent substrate A2 | Ink A1 | 30 | 1,500 | 1.0 | 0.142 | 0.29 | 0.30 | 0.99 | 1.29 | 111 | 92 | 2.00 | 113 |
| Example A10 | Transparent substrate A1 | Ink A2 | 28 | 1,500 | 1.0 | 0.203 | 0.19 | 0.25 | 1.00 | 1.25 | 121 | 90 | 2.45 | 114 |
| Example A11 | Transparent substrate A1 | Ink A2 | 22 | 2,000 | 1.0 | 0.189 | 0.13 | 0.28 | 1.00 | 1.28 | 119 | 90 | 2.22 | 125 |
| Example A12 | Transparent substrate A1 | Ink A2 | 37 | 1,200 | 1.0 | 0.222 | 0.37 | 0.17 | 0.99 | 1.16 | 129 | 90 | 2.87 | 120 |
| Comparative Example A1 | Transparent substrate A1 | Ink A1 | 20 | 2,600 | 1.0 | 0.064 | 0.07 | 0.64 | 1.00 | 1.64 | 108 | 92 | 1.33 | 163 |
| Comparative Example A2 | Transparent substrate A1 | Ink A1 | 44 | 800 | 1.0 | 0.352 | 0.45 | 0.14 | 0.79 | 0.93 | 164 | 92 | 3.03 | 136 |
| Comparative Example A3 | Transparent substrate A1 | Ink A2 | 20 | 2,600 | 1.0 | 0.177 | 0.03 | 0.61 | 1.00 | 1.61 | 115 | 90 | 1.99 | 222 |
| Comparative Example A4 | Transparent substrate A1 | Ink A2 | 44 | 800 | 1.0 | 0.268 | 0.51 | 0.10 | 0.70 | 0.80 | 195 | 90 | 3.57 | 155 |
| Reference Example A1 | Transparent substrate A1 | Ink A1 | 30 | 3,000 | 10.0 | 2.032 | 0.22 | 0.40 | 1.00 | 1.40 | 103 | 88 | 1.19 | 104 |
| Reference Example A2 | Transparent substrate A1 | Ink A1 | 30 | 5,000 | 10.0 | 0.628 | 0.05 | 0.64 | 1.00 | 1.64 | 97 | 88 | 1.23 | 117 |

Examples A1 to A12, Comparative Examples A1 to A4, and Reference Examples A1 and A2 demonstrated that a conductive film having high transparency (i.e., low visibility because of a small line width), high conductivity (i.e., low sheet resistance) and flexibility at the same time can be obtained by adjusting the ratio of the total cross-sectional area of the voids to the cross-sectional area of the fine metal wire to a specific range in a line width region of 5 μm or smaller of the fine metal wire.

[Preparation of Transparent Substrate B1]

Polyethylene terephthalate (PET) was used as a transparent substrate. An intermediate layer having a thickness of 50 nm and containing silicon oxide was formed thereon by film formation according to the sputtering method to obtain transparent substrate B1. The transparent substrate B1 was in a form where the intermediate layer was laminated on the transparent substrate PET.

[Preparation of Transparent Substrate B2]

Polyethylene terephthalate (PET) was used as a transparent substrate. A composition for intermediate layer formation containing silicon oxide nanoparticles and a conductive organosilane compound was applied onto PET and dried so that a film having an antistatic function, having a thickness of 150 nm and a volume resistivity of 5000 Ωcm, and containing silicon oxide was formed as an intermediate layer to obtain transparent substrate B2.

[Ink B1]

20 parts by mass of copper oxide nanoparticles (fine cupric oxide particles manufactured by CIK NanoTek Corp.), 4 parts by mass of a dispersant (manufactured by BYK-Chemie GmbH, product name: Disperbyk-145), 1 part by mass of a surfactant (manufactured by AGC Seimi Chemical Co., Ltd., product name: S-611), and 75 parts by mass of an organic solvent (n-butanol and 2-propylene glycol) were mixed to prepare ink B1 containing the copper oxide nanoparticles dispersed therein.

Examples B1 to B10 and Comparative Examples B1 to B4

First, ink was applied to transfer medium surface. Subsequently, the transfer medium surface coated with ink was allowed to face a printing plate having grooves of a fine metal wire pattern, pressed and contacted to transfer a portion of the ink on the transfer medium surface to the protruding portion surface of the printing plate. Then, the transfer medium surface coated with the remaining ink was allowed to face the transparent substrate shown in Table 2, pressed and contacted to transfer the ink having the desired fine metal wire pattern onto the transparent substrate. In this formation step, the values of $W_{0.90}/W_0$ and $W_{0.50}/W_0$ in each of Examples and Comparative Examples were controlled by varying process times for transferring the ink to a relief printing plate. A longer process time resulted in smaller values of $W_{0.90}/W_0$ and $W_{0.50}/W_0$. Subsequently, the ink having the fine metal wire pattern was sintered by flash lamp annealing in a room temperature environment using Pulseforge 1300 manufactured by NovaCentrix to obtain a conductive film having a fine metal wire in a mesh pattern having the line width shown in Table 2. The fine metal wires of all the obtained conductive films were unable to be visually confirmed because of the low visibility of the fine metal wire. Various characteristics of the obtained conductive films are shown in Table 2.

Hereinafter, methods for evaluating various characteristics of the conductive film will be shown.

[Sheet Resistance]

Sheet resistance $R_{s0}$ (Ω/sq) of the obtained conductive film was measured by the following method: a 100 mm width×100 mm depth rectangular measurement sample was cut out of a region where the fine metal wire pattern was formed in the conductive film. Subsequently, silver paste was applied to both ends in the width direction of the surface of this measurement sample using a screen printing apparatus, and dried to form 10 mm width×100 mm depth current collector parts as shown in FIG. 15. Subsequently, electrical resistance R (Ω) between the formed current collector parts was measured by the two-terminal method involving the contact of ohmmeter measuring terminals. Subsequently, sheet resistance $R_{s0}$ (Ω/sq) was calculated using length L: 80 (mm) in the width direction (which corresponds to the distance between the current collector parts) and length D: 100 (mm) in the depth direction of a region where the fine metal wire pattern was disposed except for the current collector parts, of the measurement sample.

$$R_{s0}=R/L \times D$$

The sheet resistance of a conductive film having a protective layer on the surface was measured by preparing a conductive film in which the current collector parts were exposed from the fine metal wire pattern and the other part of the fine metal wire pattern was covered with the protective layer. Specifically, the current collector parts formed by the method mentioned above were masked. A protective layer was formed. Finally, the masking was removed to prepare a conductive film in which only the current collector parts were exposed.

[Visible Light Transmittance and Haze]

The visible light transmittance of the conductive film was measured by calculating a transmittance to visible light having a wavelength of 360 to 830 nm in accordance with JIS K 7361-1: 1997 for total light transmittance. The haze of the conductive film was also measured in accordance with JIS K 7136: 2000.

[SEM Observation of Fine Metal Wire Cross-Section]

A small piece of several mm square was cut out of the obtained conductive film and BIB-processed with argon ion beam by the method mentioned above under conditions involving an acceleration voltage of 4 kV using SM-09010CP manufactured by JEOL Ltd. to prepare a measurement sample including the cross-section of the fine metal wire perpendicular to the direction of drawing of the fine metal wire. Subsequently, the cross-sectional surface of the fine metal wire was treated by Os plasma coating for conferring conductivity.

Subsequently, a SEM image of the cross-section of the fine metal wire was obtained under conditions given below using a scanning electron microscope (SU8220) manufactured by Hitachi High-Technologies Corp.

Acceleration voltage: 1 kV

Emission current: 10 μA

Measurement magnification: ×50,000

Detector: upper detector

Working distance: approximately 3 mm

Figure 17:
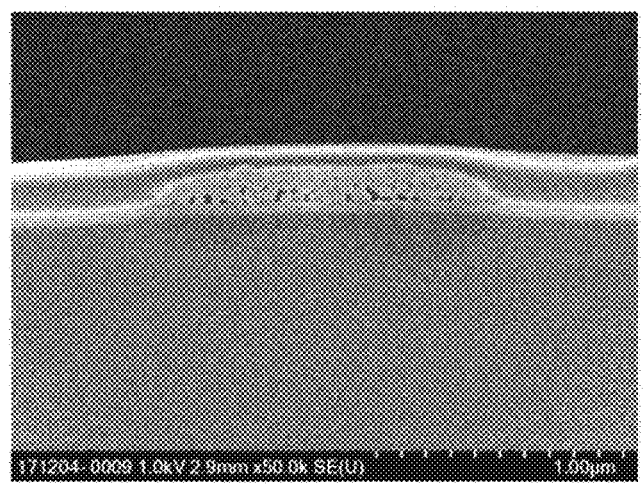
FIG. 17 shows a cross-sectional SEM image of a fine metal wire of Example B1.
Figure 18:
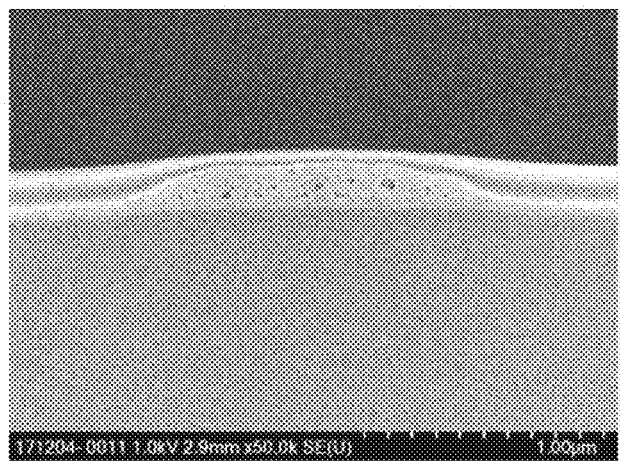
FIG. 18 shows a cross-sectional SEM image of a fine metal wire of Example B7.

FIG. 17 shows a cross-sectional SEM image of the fine metal wire of Example B1. FIG. 18 shows a cross-sectional SEM image of the fine metal wire of Example B7. First, maximum thickness T from the fine metal wire interface on the transparent substrate side to the fine metal wire surface was calculated from the obtained SEM image of the cross-section of the fine metal wire. Subsequently, width $W_0$ of the fine metal wire on the fine metal wire interface on the transparent substrate side, and widths $W_{0.50}$ and $W_{0.90}$ of the fine metal wire at heights of 0.50T and 0.90T, respectively, from the fine metal wire interface on the transparent substrate side were calculated. $W_{0.90}/W_0$, $W_{0.50}/W_0$, and $W_{0.90}/W_{0.50}$ were each calculated using these values.

[Formation of Protective Layer]

A protective layer was formed on the fine metal wire of the conductive film of each of Examples B1 to B10 and Comparative Examples B1 to B4 under the same formation conditions using thermosetting epoxy resin. Subsequently, a preservation test was conducted for 7 days in an environment of 25° C. and 50% RH. Then, sheet resistance $R_{s1}$ of the conductive film after the preservation test was measured. The rate of change in sheet resistance (%) from sheet resistance $R_{s0}$ before the preservation test was calculated.

(Rate of change in sheet resistance)=$R_{s1}/R_{s0}\times100$ (manufactured by BYK-Chemie GmbH, product name: Disperbyk-145), 1 part by mass of a surfactant (manufactured by AGC Seimi Chemical Co., Ltd., product name: S-611), and 75 parts by mass of ethanol were mixed and dispersed to prepare ink C1 having a cuprous oxide nanoparticle content ratio of 20% by mass.

Examples C1 to C17 and Comparative Examples C1 to C12

<<Preparation of Conductive Film>>

First, ink C1 was applied to transfer medium surface. Subsequently, the transfer medium surface coated with ink was allowed to face a printing plate having grooves of a fine metal wire pattern, pressed and contacted to transfer a

TABLE 2

| | | | Conductive film | | | | | Evaluation | | | |
|---|---|---|---|---|---|---|---|---|---|---|---|
| | Transparent substrate Name | Ink Name | Line width $W_0$ (μm) | $W_{0.90}/W_0$ | $W_{0.50}/W_0$ | $W_{0.90}/W_{0.50}$ | Maximum thickness T (μm) | Sheet resistance (Ω/sp) | Visible light transmittance (%) | Haze (%) | Rate of change in sheet resistance (%) |
| Example B1 | Transparent substrate B1 | Ink B1 | 1.1 | 0.45 | 0.72 | 0.63 | 0.13 | 110 | 90 | 1.7 | 105 |
| Example B2 | Transparent substrate B1 | Ink B1 | 1.0 | 0.49 | 0.81 | 0.60 | 0.18 | 108 | 91 | 1.9 | 104 |
| Example B3 | Transparent substrate B1 | Ink B1 | 1.3 | 0.63 | 0.85 | 0.74 | 0.27 | 101 | 89 | 1.3 | 111 |
| Example B4 | Transparent substrate B1 | Ink B1 | 0.9 | 0.70 | 0.89 | 0.79 | 0.10 | 123 | 91 | 1.6 | 109 |
| Example B5 | Transparent substrate B1 | Ink B1 | 1.3 | 0.84 | 0.97 | 0.87 | 0.33 | 104 | 89 | 2.1 | 115 |
| Example B6 | Transparent substrate B2 | Ink B1 | 0.9 | 0.42 | 0.72 | 0.58 | 0.11 | 135 | 90 | 2.0 | 109 |
| Example B7 | Transparent substrate B2 | Ink B1 | 1.4 | 0.49 | 0.82 | 0.60 | 0.16 | 122 | 89 | 1.9 | 110 |
| Example B8 | Transparent substrate B2 | Ink B1 | 1.3 | 0.69 | 0.93 | 0.74 | 0.15 | 109 | 89 | 1.7 | 107 |
| Example B9 | Transparent substrate B2 | Ink B1 | 1.1 | 0.75 | 0.96 | 0.78 | 0.14 | 105 | 90 | 1.7 | 112 |
| Example B10 | Transparent substrate B2 | Ink B1 | 1.0 | 0.87 | 0.98 | 0.89 | 0.16 | 100 | 90 | 1.8 | 122 |
| Comparative Example B1 | Transparent substrate B1 | Ink B1 | 1.1 | 0.30 | 0.67 | 0.45 | 0.14 | 352 | 90 | 1.8 | 107 |
| Comparative Example B2 | Transparent substrate B1 | Ink B1 | 0.8 | 0.92 | 0.94 | 0.98 | 0.14 | 118 | 91 | 1.1 | 153 |
| Comparative Example B3 | Transparent substrate B2 | Ink B1 | 1.1 | 0.36 | 0.67 | 0.54 | 0.09 | 190 | 90 | 2.1 | 111 |
| Comparative Example B4 | Transparent substrate B2 | Ink B1 | 1.1 | 0.92 | 0.99 | 0.93 | 0.15 | 98 | 90 | 1.9 | 177 |

Examples B1 to B5 and Comparative Examples B1 and B2 as well as Examples B6 to B10 and Comparative Examples B3 and B4 demonstrated that a conductive film in which a covering layer such as a protective layer can be more uniformly formed on fine metal wire surface can be obtained by adjusting $W_{0.90}/W_0$ to within a specific range.

[Preparation of Transparent Substrate C1]

Polyethylene terephthalate (PET) was used as a transparent substrate. A composition for intermediate layer formation containing silicon oxide nanoparticles and a conductive organosilane compound was applied onto PET and dried so that a film having an antistatic function, having a thickness of 150 nm and a volume resistivity of 5000 Ωcm, and containing silicon oxide was formed as an intermediate layer to obtain transparent substrate C1.

[Ink C1]

20 parts by mass of cuprous oxide nanoparticles having a particle size of 21 nm, 4 parts by mass of a dispersant portion of the ink on the transfer medium surface to the protruding portion surface of the printing plate. Then, the transfer medium surface coated with the remaining ink was allowed to face a transparent substrate, pressed and contacted to transfer the ink having the desired fine metal wire pattern onto the transparent substrate. In this formation step, the values of $W_{0.90}/W_0$ and $W_{0.50}/W_0$ in each of Examples and Comparative Examples were controlled by varying process times for transferring the ink to a relief printing plate. A longer process time resulted in smaller values of $W_{0.90}/W_0$ and $W_{0.50}/W_0$. Subsequently, the ink pattern was sintered and reduced under the conditions described in Table 3 using a plasma sintering apparatus to obtain a conductive film having a fine metal wire in a mesh pattern. Various characteristics of the obtained conductive films are shown in Table 3. The fine metal wires of all the obtained conductive films were unable to be visually confirmed because of the low visibility of the fine metal wire.

Hereinafter, methods for evaluating various characteristics of the conductive film will be shown.

[Sheet Resistance]

Sheet resistance $R_{s0}$ (Ω/sq) of the obtained conductive film was measured by the following method: a measurement sample of 100 mm square was cut out of a portion throughout which the fine metal wire pattern was disposed in the conductive film. Subsequently, silver paste was applied to both ends in the width direction of the surface of the obtained measurement sample using a screen printing apparatus, and dried to form current collector parts which is 10 mm width×100 mm depth as shown in FIG. 15. Subsequently, electrical resistance R (Ω) between the current collector parts at both ends of the sample was measured by the two-terminal method involving the contact of ohmmeter measuring terminals. The sheet resistance $R_{s0}$ (Ω/sq) was calculated according to an expression given below from the obtained electrical resistance. The sheet resistance of a conductive film having a protective layer on the surface was measured by preparing a conductive film in which the current collector parts were exposed from the fine metal wire pattern and the other part of the fine metal wire pattern was covered with the protective layer. Specifically, the current collector parts formed by the method mentioned above were masked. A protective layer was formed. Finally, the masking was removed to prepare a conductive film in which only the current collector parts were exposed.

$$R_{s0} = R/L \times D$$

L: 80 (mm): distance between the current collector parts
D: 100 (mm): depth of the measurement sample

[Visible Light Transmittance and Haze]

The visible light transmittance of the conductive film was measured by calculating a transmittance to visible light having a wavelength of 360 to 830 nm in accordance with JIS K 7361-1: 1997 for total light transmittance. The haze of the conductive film was also measured in accordance with JIS K 7136: 2000.

[SEM Observation of Fine Metal Wire Cross-Section]

A small piece of several mm square was cut out of the obtained conductive film and BIB-processed with argon ion beam by the method mentioned above under conditions involving an acceleration voltage of 4 kV using SM-09010CP manufactured by JEOL Ltd. to prepare a measurement sample including the cross-section of the fine metal wire perpendicular to the direction of drawing of the fine metal wire. Subsequently, the cross-sectional surface of the fine metal wire was treated by Os plasma coating for conferring conductivity.

Subsequently, a SEM image of the cross-section of the fine metal wire was obtained under conditions given below using a scanning electron microscope (SU8220) manufactured by Hitachi High-Technologies Corp.

Acceleration voltage: 1 kV
Emission current: 10 μA
Measurement magnification: ×50,000
Detector: upper detector
Working distance: approximately 3 mm First, maximum thickness T from the fine metal wire interface on the transparent substrate side to the fine metal wire surface was calculated from the obtained SEM image of the cross-section of the fine metal wire.

The SEM image of the cross-section of the fine metal wire was analyzed using ImageJ. Specifically, only the cross-section of the fine metal wire was extracted from the SEM image (8 bit), and fine noise contained in the image was removed by median filter treatment. Subsequently, the extracted cross-section of the fine metal wire was binarized. $S_M$, $S_{Vtotal}$, $S_{V0.2}$, and $S_{V0.8}$ were each calculated, and $S_{Vtotal}/S_M$, $S_{V0.2}/S_{Vtotal}$, $S_{V0.8}/S_{Vtotal}$, and $(S_{V0.2}+S_{V0.8})/S_{Vtotal}$ were calculated.

Subsequently, width $W_0$ of the fine metal wire on the fine metal wire interface on the transparent substrate side, and widths $W_{0.50}$ and $W_{0.90}$ of the fine metal wire at heights of 0.50T and 0.90T, respectively, from the fine metal wire interface on the transparent substrate side were calculated. $W_{0.90}/W_0$, $W_{0.50}/W_0$, and $W_{0.90}/W_{0.50}$ were each calculated using these values.

$(1+W_{0.90}/W_0) \cdot (1-S_{Vtotal}/S_M)$ was further calculated using these values.

[Flexibility]

In order to evaluate the flexibility of the obtained conductive film, a repeated bending test was conducted in an environment of 60° C. and 90% RH, and the rate of change in sheet resistance (%) between before and after the test was measured. In the case of poor durability, the rate of change in sheet resistance was large due to the breaking or oxidation of the fine metal wire, etc. In the case of excellent durability, the rate of change in sheet resistance was small.

First, a protective layer was formed on the fine metal wire of the conductive film using thermosetting epoxy resin. Then, sheet resistance $R_{s0}$ (Ω/sq) of the conductive film was measured before the repeated bending test by the same method as above. Subsequently, the conductive film was subjected to the repeated bending test under conditions given below in accordance with JIS C 5016: 1994 using a commercially available bending tester.

Bend radius: 5 mm
Test stroke: 20 mm
Bending rate: 60 rpm
The number of times of bending: 10,000

Finally, sheet resistance $R_{s1}$ (Ω/sq) of the conductive film was measured after the repeated bending test. The rate of change in sheet resistance was calculated according to the following expression.

(Rate of change in sheet resistance)=$R_{s1}/R_{s0} \times 100$

TABLE 3-1

| | | | Plasma sintering | | | Conductive film | | | | | | | | $(1 + W_{0.90}/W_0) \cdot (1 - S_{Vtotal}/S_M)$ | Evaluation | | | |
|---|---|---|---|---|---|---|---|---|---|---|---|---|---|---|---|---|---|---|
| | Transparent substrate Name | Ink Name | Temperature (° C.) | Power (kW) | Treatment time (sec) | Line width $W_0$ (μm) | $S_{Vtotal}/S_M$ | $S_{V0.2}/S_{Vtotal}$ | $S_{V0.8}/S_{Vtotal}$ | $(S_{V0.2}+S_{V0.8})/S_{Vtotal}$ | $W_{0.90}/W_0$ | $W_{0.50}/W_0$ | $W_{0.90}/W_{0.50}$ | | Sheet resistance (Ω/sq) | Visible light transmittance (%) | Haze (%) | Rate of change in sheet resistance (%) |
| Example C1 | Transparent substrate C1 | Ink C1 | 50 | 1.0 | 240 | 1.0 | 0.10 | 0.56 | 1.00 | 1.56 | 0.68 | 0.92 | 0.74 | 1.51 | 111 | 90 | 2.79 | 137 |
| Example C2 | Transparent substrate C1 | Ink C1 | 50 | 1.0 | 230 | 1.1 | 0.11 | 0.53 | 1.00 | 1.53 | 0.71 | 0.94 | 0.76 | 1.52 | 111 | 90 | 2.71 | 132 |

TABLE 3-1-continued

| | | Plasma sintering | | | Conductive film | | | | | | | | | Evaluation | | | |
|---|---|---|---|---|---|---|---|---|---|---|---|---|---|---|---|---|---|
| Transparent substrate Name | Ink Name | Temperature (°C.) | Power (kW) | Treatment time (sec) | Line width $W_0$ (μm) | $S_{Vtotal}/S_M$ | $S_{V0.2}/S_{Vtotal}$ | $S_{V0.8}/S_{Vtotal}$ | $(S_{V0.2}+S_{V0.8})/S_{Vtotal}$ | $W_{0.90}/W_0$ | $W_{0.50}/W_0$ | $W_{0.90}/W_{0.50}$ | $(1+W_{0.90}/W_0)\cdot(1-S_{Vtotal}/S_M)$ | Sheet resistance (Ω/sp) | Visible light transmittance (%) | Haze (%) | Rate of change in sheet resistance (%) |
| Example C3 | Transparent substrate C1 | Ink C1 | 50 | 1.0 | 220 | 1.1 | 0.13 | 0.49 | 1.00 | 1.49 | 0.70 | 0.94 | 0.74 | 1.48 | 113 | 90 | 2.66 | 129 |
| Example C4 | Transparent substrate C1 | Ink C1 | 50 | 1.0 | 200 | 1.1 | 0.16 | 0.42 | 1.00 | 1.42 | 0.66 | 0.91 | 0.73 | 1.39 | 119 | 91 | 2.54 | 124 |
| Example C5 | Transparent substrate C1 | Ink C1 | 50 | 1.0 | 180 | 1.0 | 0.30 | 0.28 | 1.00 | 1.28 | 0.65 | 0.90 | 0.72 | 1.16 | 134 | 91 | 2.01 | 116 |
| Example C6 | Transparent substrate C1 | Ink C1 | 50 | 1.1 | 150 | 0.9 | 0.34 | 0.26 | 0.99 | 1.25 | 0.63 | 0.89 | 0.71 | 1.08 | 159 | 90 | 1.99 | 122 |
| Example C7 | Transparent substrate C1 | Ink C1 | 50 | 1.3 | 100 | 1.0 | 0.37 | 0.24 | 0.99 | 1.23 | 0.66 | 0.91 | 0.73 | 1.05 | 169 | 89 | 1.96 | 126 |
| Example C8 | Transparent substrate C1 | Ink C1 | 50 | 1.3 | 90 | 0.8 | 0.39 | 0.25 | 0.98 | 1.23 | 0.59 | 0.89 | 0.66 | 0.97 | 177 | 90 | 1.97 | 135 |
| Example C9 | Transparent substrate C1 | Ink C1 | 50 | 1.1 | 180 | 1.1 | 0.23 | 0.35 | 1.00 | 1.35 | 0.84 | 0.97 | 0.87 | 1.42 | 116 | 90 | 2.05 | 111 |
| Example C10 | Transparent substrate C1 | Ink C1 | 50 | 1.3 | 90 | 1.1 | 0.40 | 0.22 | 0.89 | 1.11 | 0.42 | 0.73 | 0.58 | 0.85 | 198 | 88 | 1.96 | 134 |
| Example C11 | Transparent substrate C1 | Ink C1 | 50 | 1.3 | 90 | 1.0 | 0.39 | 0.23 | 0.90 | 1.13 | 0.53 | 0.76 | 0.70 | 0.93 | 176 | 90 | 1.93 | 131 |
| Example C12 | Transparent substrate C1 | Ink C1 | 50 | 1.3 | 90 | 0.9 | 0.37 | 0.25 | 0.88 | 1.13 | 0.83 | 0.98 | 0.85 | 1.15 | 143 | 90 | 1.95 | 135 |
| Example C13 | Transparent substrate C1 | Ink C1 | 50 | 1.3 | 90 | 1.0 | 0.37 | 0.21 | 0.90 | 1.11 | 0.89 | 0.99 | 0.90 | 1.19 | 139 | 89 | 1.95 | 139 |
| Example C14 | Transparent substrate C1 | Ink C1 | 50 | 1.0 | 180 | 0.6 | 0.24 | 0.36 | 1.00 | 1.36 | 0.57 | 0.71 | 0.80 | 1.19 | 257 | 91 | 2.24 | 124 |
| Example C15 | Transparent substrate C1 | Ink C1 | 50 | 1.0 | 180 | 2.2 | 0.28 | 0.29 | 1.00 | 1.29 | 0.68 | 0.77 | 0.88 | 1.21 | 78 | 89 | 1.98 | 113 |
| Example C16 | Transparent substrate C1 | Ink C1 | 50 | 1.0 | 180 | 3.1 | 0.19 | 0.44 | 1.00 | 1.44 | 0.75 | 0.86 | 0.87 | 1.42 | 45 | 89 | 1.89 | 112 |
| Example C17 | Transparent substrate C1 | Ink C1 | 50 | 1.0 | 180 | 4.8 | 0.18 | 0.38 | 1.00 | 1.38 | 0.81 | 0.95 | 0.85 | 1.48 | 24 | 88 | 1.92 | 112 |

TABLE 3-2

| | | Plasma sintering | | | Conductive film | | | | | | | | | Evaluation | | | |
|---|---|---|---|---|---|---|---|---|---|---|---|---|---|---|---|---|---|
| Transparent substrate Name | Ink Name | Temperature (°C.) | Power (kW) | Treatment time (sec) | Line width $W_0$ (μm) | $S_{Vtotal}/S_M$ | $S_{V0.2}/S_{Vtotal}$ | $S_{V0.8}/S_{Vtotal}$ | $(S_{V0.2}+S_{V0.8})/S_{Vtotal}$ | $W_{0.90}/W_0$ | $W_{0.50}/W_0$ | $W_{0.90}/W_{0.50}$ | $(1+W_{0.90}/W_0)\cdot(1-S_{Vtotal}/S_M)$ | Sheet resistance (Ω/sp) | Visible light transmittance (%) | Haze (%) | Rate of change in sheet resistance (%) |
| Comparative Example C1 | Transparent substrate C1 | Ink C1 | 50 | 1.1 | 300 | 0.9 | 0.04 | 0.64 | 1.00 | 1.64 | 0.71 | 0.91 | 0.78 | 1.64 | 116 | 90 | 2.89 | 192 |
| Comparative Example C2 | Transparent substrate C1 | Ink C1 | 50 | 1.5 | 50 | 0.9 | 0.53 | 0.13 | 0.84 | 0.97 | 0.63 | 0.90 | 0.70 | 0.77 | 262 | 90 | 1.99 | 170 |
| Comparative Example C3 | Transparent substrate C1 | Ink C1 | 50 | 1.4 | 60 | 1.0 | 0.42 | 0.22 | 0.87 | 1.09 | 0.32 | 0.68 | 0.47 | 0.77 | 244 | 90 | 1.97 | 145 |
| Comparative Example C4 | Transparent substrate C1 | Ink C1 | 50 | 1.4 | 90 | 1.2 | 0.45 | 0.19 | 0.87 | 1.06 | 0.94 | 1.00 | 0.94 | 1.07 | 153 | 90 | 2.00 | 180 |
| Comparative Example C5 | Transparent substrate C1 | Ink C1 | 50 | 1.1 | 300 | 0.6 | 0.06 | 0.62 | 1.00 | 1.62 | 0.54 | 0.89 | 0.61 | 1.45 | 248 | 90 | 2.78 | 245 |

TABLE 3-2-continued

| | | Plasma sintering | | | Line width $W_0$ (μm) | $S_{Vtotal}/S_M$ | $S_{V0.2}/S_{Vtotal}$ | $S_{V0.8}/S_{Vtotal}$ | $(S_{V0.2}+S_{V0.8})/S_{Vtotal}$ | $W_{0.90}/W_0$ | $W_{0.50}/W_0$ | $W_{0.90}/W_{0.50}$ | $(1+W_{0.90}/W_0)\cdot(1-S_{Vtotal}/S_M)$ | Sheet resistance (Ω/sp) | Visible light transmittance (%) | Haze (%) | Rate of change in sheet resistance (%) |
|---|---|---|---|---|---|---|---|---|---|---|---|---|---|---|---|---|---|
| Transparent substrate Name | Ink Name | Temperature (°C.) | Power (kW) | Treatment time (sec) | | | | | | | | | | | | | |
| Comparative Example C6 | Transparent substrate C1 | Ink C1 | 50 | 1.5 | 50 | 0.5 | 0.68 | 0.13 | 0.79 | 0.92 | 0.56 | 0.90 | 0.62 | 0.50 | 699 | 90 | 1.95 | 173 |
| Comparative Example C7 | Transparent substrate C1 | Ink C1 | 50 | 1.1 | 300 | 2.1 | 0.05 | 0.60 | 1.00 | 1.60 | 0.67 | 0.92 | 0.73 | 1.59 | 76 | 90 | 2.65 | 189 |
| Comparative Example C8 | Transparent substrate C1 | Ink C1 | 50 | 1.5 | 50 | 2.0 | 0.45 | 0.14 | 0.84 | 0.98 | 0.65 | 0.91 | 0.71 | 0.91 | 101 | 90 | 2.01 | 163 |
| Comparative Example C9 | Transparent substrate C1 | Ink C1 | 50 | 1.1 | 300 | 2.9 | 0.07 | 0.54 | 1.00 | 1.54 | 0.74 | 0.95 | 0.78 | 1.62 | 43 | 90 | 2.94 | 179 |
| Comparative Example C10 | Transparent substrate C1 | Ink C1 | 50 | 1.5 | 50 | 3.1 | 0.44 | 0.19 | 0.80 | 0.99 | 0.75 | 0.95 | 0.79 | 0.98 | 76 | 90 | 2.10 | 164 |
| Comparative Example C11 | Transparent substrate C1 | Ink C1 | 50 | 1.1 | 300 | 4.8 | 0.08 | 0.53 | 1.00 | 1.53 | 0.80 | 0.95 | 0.84 | 1.66 | 23 | 90 | 3.04 | 182 |
| Comparative Example C12 | Transparent substrate C1 | Ink C1 | 50 | 1.5 | 50 | 4.9 | 0.49 | 0.17 | 0.79 | 0.96 | 0.79 | 0.97 | 0.81 | 0.91 | 45 | 90 | 2.13 | 161 |

Examples C1 to C17 and Comparative Examples C1 to C12 demonstrated that $S_{Vtotal}/S_M$ is adjusted to a range of 0.1 to 0.4, thereby achieving low visibility and a high transmittance by thinning while improving flexibility. These examples further demonstrated that $W_{0.90}/W_0$ is adjusted to a range of 0.4 to 0.9, thereby enabling a protective layer to be more uniformly formed on fine metal wire surface, and suppressing the oxidation of the fine metal wire at a high temperature and humidity. In addition, these examples demonstrated that $(1+W_{0.90}/W_0)\cdot(1-S_{Vtotal}/S_M)$ is adjusted to 0.84 to 1.71, thereby enabling higher conductivity to be exerted while achieving all of the effects mentioned above.

The present application is based on Japanese Patent Applications (Japanese Patent Application Nos. 2018-142101 and 2018-142057) filed in the Japan Patent Office on Jul. 30, 2018, the contents of which are incorporated herein by reference.

INDUSTRIAL APPLICABILITY

The conductive film of the present invention can be suitably used as a transparent electrode for an electronic paper, a touch panel, and a flat-panel display, etc., and thus has industrial applicability.

REFERENCE SIGNS LIST

10 . . . Conductive film
11 . . . Transparent substrate
12 . . . Fine metal wire pattern
13 . . . Conductive part
14 . . . Fine metal wire
15 . . . Opening part
16 . . . Pattern unit
20 . . . Electronic paper
21 . . . Cup
22 . . . Black pigment
23 . . . White pigment
24 . . . Bottom electrode
30 . . . Touch panel
31 . . . Insulator
32 . . . Extraction electrode
33 . . . Controller

The invention claimed is:

1. A conductive film comprising a transparent substrate and a conductive part comprising a fine metal wire pattern disposed on one side or both sides of the transparent substrate, wherein
the fine metal wire pattern is constituted by a fine metal wire, and
the conductive film satisfies the following condition (1) or (ii):
(i) the fine metal wire has voids, and when the cross-sectional area of the fine metal wire is defined as $S_M$ and the total cross-sectional area of the voids included in the cross-section of the fine metal wire is defined as $S_{Vtotal}$ on the cross-section of the fine metal wire perpendicular to the direction of drawing of the fine metal wire, $S_{Vtotal}/S_M$ is 0.10 or more and 0.40 or less; and (ii) when the maximum thickness of the fine metal wire on the cross-section of the fine metal wire perpendicular to the direction of drawing of the fine metal wire is defined as T, the width of the fine metal wire at a height of 0.90T from the fine metal wire interface on the transparent substrate side is defined as $W_{0.90}$ and the width of the fine metal wire on the fine metal wire interface on the transparent substrate side is defined as $W_0$, $W_{0.90}/W_0$ is 0.40 or more and 0.90 or less.

2. The conductive film according to claim 1, wherein $(1+W_{0.09}/W_0)-(1-S_{Vtotal}/S_M)$ is 0.84 or more and 1.71 or less.

3. The conductive film according to claim 1, wherein the fine metal wire has the voids on the fine metal wire interface on the transparent substrate side.

4. The conductive film according to claim 1, wherein when the maximum thickness of the fine metal wire is defined as T and the cross-sectional area of the voids in a thickness region from the fine metal wire interface to 0.2T on the transparent substrate side is defined as $S_{V0.2}$, $S_{V0.2}/S_{Vtotal}$ is 0.15 or More and 0.60 or Less.

5. The conductive film according to claim 1, wherein when the maximum thickness of the fine metal wire is defined as T and the cross-sectional area of the voids in a thickness region from the fine metal wire interface to 0.8T on the transparent substrate side is defined as $S_{V0.8}$, $S_{V0.8}/S_{Vtotal}$ is 0.80 or more and 1.00 or less.

6. The conductive film according to claim 1, wherein $(S_{V0.2}+S_{V0.8})/Sb$ total is more than 1.00 and 1.60 or less.

7. The conductive film according to claim 1, wherein when the width of the fine metal wire at a thickness of 0.50T from the fine metal wire interface on the transparent substrate side is defined as $W_{0.50}$, $W_{0.50}/W_0$ is 0.70 or more and less than 1.00.

8. The conductive film according to claim 1, wherein $W_{0.90}/W_{0.50}$ is 0.50 or more and 0.95 or less.

9. The conductive film according to claim 1, wherein $W_{0.50}/W_0$ is larger than $W_{0.90}/W_{0.50}$.

10. The conductive film according to claim 1, wherein a line width of the fine metal wire is 0.1 μm or larger and 5.0 μm or smaller.

11. The conductive film according to claim 10, wherein an aspect ratio of the fine metal wire is 0.05 or more and 0.1.00 or less.

12. The conductive film according to claim 10, wherein a sheet resistance of the conductive film is 0.1 Ω/sq or more and 1,000 Ω/sq or less.

13. The conductive film according to claim 10, wherein a visible light transmittance of the conductive film is 80% or more and 100% or less.

14. The conductive film according to claim 10, wherein a haze of the conductive film is 0.01% or more and 5.00% or less.

15. The conductive film according to claim 10, wherein an aperture ratio of the fine metal wire pattern is 80% or more and less than 100%.

16. The conductive film according to claim 10, comprising
an intermediate layer between the transparent substrate and the conductive part.

17. The conductive film according to claim 16, wherein the intermediate layer comprises at least one member selected from the group consisting of silicon oxide, silicon nitride, aluminum oxide, and magnesium fluoride.

18. An electronic paper comprising
a conductive film according to claim 10.

19. A touch panel comprising
a conductive film according to claim 10.

20. A flat-panel display comprising
a conductive film according to claim 10.

* * * * *